(12) United States Patent
Jinbo

(10) Patent No.: US 7,821,012 B2
(45) Date of Patent: Oct. 26, 2010

(54) THIN FILM TRANSISTOR

(75) Inventor: Yasuhiro Jinbo, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/397,460

(22) Filed: Mar. 4, 2009

(65) Prior Publication Data

US 2009/0236601 A1 Sep. 24, 2009

(30) Foreign Application Priority Data

Mar. 18, 2008 (JP) ............................. 2008-070451

(51) Int. Cl.
*H01L 33/00* (2010.01)
(52) U.S. Cl. ................. 257/72; 257/288; 257/E29.273; 257/E33.053
(58) Field of Classification Search ................... 257/72, 257/288, E29.273, E33.053
See application file for complete search history.

(56) References Cited

U.S. PATENT DOCUMENTS

| | | |
|---|---|---|
| 4,409,134 A | 10/1983 | Yamazaki |
| 5,101,242 A | 3/1992 | Ikeda et al. |
| 5,221,631 A | 6/1993 | Ikeda et al. |
| 5,864,150 A | 1/1999 | Lin |
| 6,153,893 A | 11/2000 | Inoue et al. |
| 2001/0014493 A1 | 8/2001 | Inoue et al. |
| 2005/0115930 A1 | 6/2005 | Tanaka et al. |
| 2009/0218576 A1 | 9/2009 | Dairiki et al. |

FOREIGN PATENT DOCUMENTS

| | | |
|---|---|---|
| EP | 0 535 979 A2 | 4/1993 |
| JP | 2-218166 | 8/1990 |
| JP | 05-129608 | 5/1993 |
| JP | 07-131030 | 5/1995 |
| JP | 07-047876 | 11/1995 |
| JP | 2001-053283 | 2/2001 |
| JP | 2005-049832 | 2/2005 |
| JP | 2005-191546 | 7/2005 |

*Primary Examiner*—Long Pham
(74) *Attorney, Agent, or Firm*—Nixon Peabody LLP; Jeffrey L. Costellia

(57) ABSTRACT

A thin film transistor includes a first insulating layer covering the gate electrode layer; source and drain regions which at least partly overlaps with the gate electrode layer; a pair of second insulating layers which is provided apart from each other in a channel length direction over the first insulating layer and which at least partly overlaps with the gate electrode layer and the pair of impurity semiconductor layers; a pair of microcrystalline semiconductor layers provided apart from each other on and in contact with the second insulating layers; and an amorphous semiconductor layer covering the first insulating layer, the pair of second insulating layers, and the pair of microcrystalline semiconductor layers and which extends to exist between the pair of microcrystalline semiconductor layers. The first insulating layer is a silicon nitride layer and each of the pair of the second insulating layers is a silicon oxynitride layer.

24 Claims, 12 Drawing Sheets

THIN FILM TRANSISTOR

BACKGROUND OF THE INVENTION

1. Field of the Invention

The present invention relates to thin film transistors.

2. Description of the Related Art

As one kind of electric field effect transistors, there is a known thin film transistor in which a semiconductor layer provided over a substrate having an insulating surface is used for a channel formation region. Techniques by which amorphous silicon, microcrystalline silicon, and polycrystalline silicon are used for semiconductor 1 layers of thin film transistors have been disclosed (see Patent Documents 1 to 5). Thin film transistors have been used, for example, for liquid crystal television devices and put into practical use as switching transistors for pixels of display screens thereof.

[Patent Document 1] Japanese Published Patent Application No. 2001-053283

[Patent Document 2] Japanese Published Patent Application No. HS-129608

[Patent Document 3] Japanese Published Patent Application No. 2005-049832

[Patent Document 4] Japanese Published Patent Application No. H7-131030

[Patent Document 5] Japanese Published Patent Application No. 2005-191546

SUMMARY OF THE INVENTION

A thin film transistor in which an amorphous silicon layer is used for a channel formation region has problems of low electric field effect mobility and low on current. On the other hand, a thin film transistor in which a microcrystalline silicon layer is used for a channel formation region has high electric field effect mobility as compared with a thin film transistor in which an amorphous silicon layer is used for a channel formation region. However, the thin film transistor including a microcrystalline silicon layer has a problem of high off current as well as high on current and therefore cannot have a sufficient switching characteristic.

A thin film transistor in which a polycrystalline silicon layer is used for a channel formation region has considerably higher electric field effect mobility and higher on current than the aforementioned two kinds of thin film transistors. Therefore, the thin film transistor including a polycrystalline silicon layer can be used as not only a switching transistor provided in a pixel but also a transistor for a driver circuit which needs to operate at high speed.

However, a process for manufacturing a thin film transistor in which a polycrystalline silicon layer is used for a channel formation region needs a step of crystallizing a semiconductor layer. As a result, the manufacturing cost thereof becomes higher than those of the thin film transistor including an amorphous silicon layer or the thin film transistor including a microcrystalline silicon layer. Moreover, a laser annealing technique used for the crystallization of the semiconductor layer interrupts efficient production of large-screen liquid crystal panels because the area to be irradiated with a laser beam is small.

A glass substrate used for manufacture of a display panel has grown in size from year to year: the 3rd generation (for example, 550 mm×650 mm), the 4th generation (for example, 680 mm×880 mm), the 5th generation (for example, 1000 mm×1200 mm), the 6th generation (for example, 1500 mm×1800 mm), the 7th generation (for example, 1900 mm×2200 mm), and the 8th generation (for example, 2200 mm×2400 mm) From now, the substrate is expected to grow in size further to the 9th generation (for example, 2400 mm×2800 mm) and the 10th generation (for example, 2800 mm×3000 mm). However, a technique is not yet established for manufacture of thin film transistors capable of high-speed operation (for example, the aforementioned thin film transistor including a polycrystalline silicon layer) over a large-area glass substrate with high productivity As for a technique for manufacture of thin film transistors capable of high-speed operation over a large-area substrate, technique development has been advanced on thin film transistors in which microcrystalline silicon is used for channel formation regions but their characteristics are not sufficient yet.

In view of the foregoing, an object of an embodiment of the present invention is to solve the aforementioned problems of the on current and off current of the thin film transistor. Another object of an embodiment of the present invention is to provide a thin film transistor capable of high-speed operation.

A thin film transistor according to one embodiment of the present invention includes a gate electrode layer; a first insulating layer provided so as to cover the gate electrode layer; a pair of impurity semiconductor layers provided apart from each other which at least partly overlaps with the gate electrode layer and which forms a source region and a drain region; a pair of second insulating layers which is provided apart from each other in a channel length direction over the first insulating layer and which at least partly overlaps with the gate electrode layer and the pair of impurity semiconductor layers; a pair of microcrystalline semiconductor layers provided apart from each other on and in contact with the second insulating layers; and an amorphous semiconductor layer which covers the first insulating layer, the pair of second insulating layers, and the pair of microcrystalline semiconductor layers and which extends between the pair of microcrystalline semiconductor layers, wherein the first insulating layer is a silicon nitride layer and each of the pair of second insulating layers is a silicon oxynitride layer.

A thin film transistor according to one embodiment of the present invention includes a gate electrode layer; a first insulating layer provided so as to cover the gate electrode layer; an amorphous semiconductor layer provided over the first insulating layer so as to be at least partly in contact with the first insulating layer; a pair of impurity semiconductor layers which is provided apart from each other over the amorphous semiconductor layer and which forms a source region and a drain region; a pair of microcrystalline semiconductor layers which is provided apart from each other between the first insulating layer and the amorphous semiconductor layer and which at least partly overlaps with the pair of impurity semiconductor layers; and a pair of second insulating layers provided apart from each other in contact with the microcrystalline semiconductor layers over the first insulating layer, wherein the first insulating layer is a silicon nitride layer and each of the pair of the second insulating layers is a silicon oxynitride layer.

A thin film transistor according to one embodiment of the present invention includes a gate electrode layer; a first insulating layer provided so as to cover the gate electrode layer; a pair of microcrystalline semiconductor layers provided apart from each other which at least partly overlaps with the gate electrode layer; a pair of second insulating layers provided apart from each other in contact with the first insulating layer and the pair of microcrystalline semiconductor layers; an amorphous semiconductor layer provided so as to cover at least the pair of microcrystalline semiconductor layers; and a pair of impurity semiconductor layers which is provided apart from each other over the amorphous semiconductor layer and which forms a source region and a drain region, wherein the amorphous semiconductor layer extends to exist between the pair of microcrystalline semiconductor layers, and wherein the first insulating layer is a silicon nitride layer and each of the pair of second insulating layers is a silicon oxynitride layer.

In a conventional thin film transistor, in general, the flow of carriers (electrons or holes) between a source region and a drain region is controlled by voltage (difference in potential between a gate electrode and the source region) applied to the gate electrode and the carriers flow through a semiconductor layer from the source region to the drain region. However, in the thin film transistor having any of the above structures, carriers flow between the source region and the drain region through the microcrystalline semiconductor layer provided so as to overlap with the gate electrode layer and through the amorphous semiconductor layer provided so as to extend from a portion over the microcrystalline semiconductor layer to the channel length direction.

In the thin film transistor with any of the above structures, the microcrystalline semiconductor layers are provided not throughout the entire region in the channel length direction of the thin film transistor but apart from each other, and the amorphous semiconductor layer exists between the microcrystalline semiconductor layers. That is to say, in the thin film transistor having any of the above structures, the carriers flow through the amorphous semiconductor layer in the channel at a certain distance between the source region and the drain region in the channel length direction.

In the thin film transistor having any of the above structures, the first insulating layer is a silicon nitride layer and each of the second insulating layers is a silicon oxynitride layer. That is to say, in the region where carriers flow, a silicon nitride layer is provided below and in contact with the amorphous semiconductor layer and a silicon oxynitride layer is provided below and in contact with the microcrystalline semiconductor layer. This is for the purpose of avoiding the following two problems.

The first problem is that the use of silicon oxynitride for a gate insulating film with respect to the amorphous semiconductor layer causes the threshold voltage of the transistor to shift to a positive potential side and moreover causes the subthreshold swing (also referred to as S value) to increase.

The second problem is that it is difficult to form a microcrystalline semiconductor layer over a silicon nitride layer. Even if a microcrystalline semiconductor layer can be formed over a silicon nitride layer, the crystallinity of the microcrystalline semiconductor layer is low.

In the thin film transistor having any of the above structures, the concentration of donors in the microcrystalline semiconductor layer is preferably as high as possible. This is because the increase in concentration of donors in the microcrystalline semiconductor layer leads to higher electric field effect mobility, which allows high-speed operation.

Note that silicon oxynitride means silicon that includes more oxygen than nitrogen. In the case where measurements are performed using Rutherford backscattering spectrometry (RBS) and hydrogen forward scattering (HFS), silicon oxynitride includes oxygen, nitrogen, silicon, and hydrogen at compositions ranging from 50 at. % to 70 at. %, 0.5 at. % to 15 at %, 25 at. % to 35 at. %, and 0.1 at. % to 10 at. %, respectively. Further, silicon nitride oxide means silicon that includes more nitrogen than oxygen. In the case where measurements are performed using RBS and HFS, silicon nitride oxide includes oxygen, nitrogen, silicon, and hydrogen at compositions ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

In the thin film transistor with any of the above structures, the first insulating layer is preferably formed to be thick in a region where the first insulating layer overlaps with the second insulating layer and a side surface of the microcrystalline semiconductor layer is preferably aligned approximately with a side surface of the second insulating layer. This is because the second insulating layer and the microcrystalline semiconductor layer are patterned in one etching step and moreover because many of the main components of the first insulating layer and the second insulating layer are the same.

Note that a microcrystalline semiconductor layer has an electrical conductivity of greater than or equal to $1 \times 10^{-5}$ S·cm$^{-1}$ and less than or equal to $5 \times 10^{-2}$ S·cm$^{-1}$, and an amorphous semiconductor layer has lower electrical conductivity than a microcrystalline semiconductor layer. The donor concentration of the microcrystalline semiconductor layer is greater than or equal to $1 \times 10^{18}$ cm$^{-3}$ and less than or equal to $1 \times 10^{21}$ cm$^{-3}$. The pair of microcrystalline semiconductor layers extends at least in the channel length direction of the thin film transistor and causes high on current due to the aforementioned electrical conductivity. On the other hand, the amorphous semiconductor layer which extends to the channel formation region to form a so-called offset region contributes to decrease in off current. Note that the offset region is formed between the pair of microcrystalline semiconductor layers provided apart from each other.

The impurity semiconductor refers to a semiconductor in which a majority of carriers contributing to electrical conduction are supplied from an impurity element having one conductivity type which has been added to the semiconductor. The impurity element having one conductivity type is an element which can be a donor for supplying electrons as carriers or an acceptor for supplying holes as carriers. As a typical example of the donor, there is a Group 15 element in the periodic table. As a typical example of the acceptor, there is a Group 13 element in the periodic table.

Note that the microcrystalline semiconductor refers to a semiconductor which has a crystal grain size of greater than or equal to 2 nm and less than or equal to 200 nm, preferably greater than or equal to 10 nm and less than or equal to 80 nm, and more preferably greater than or equal to 20 nm and less than or equal to 50 nm and which has an electrical conductivity of approximately $10^{-7}$ S·cm$^{-1}$ to $10^{-4}$ S·cm$^{-1}$ that can be increased to approximately $10^1$ S·cm$^{-1}$ by valence electron control. However, the microcrystalline semiconductor is not defined just by the crystal grain size and the electrical conductivity as aforementioned. A semiconductor can be regarded as the microcrystalline semiconductor as long as the semiconductor has an equivalent property value, for example, concentration of impurity element imparting one conductivity type or crystallinity.

Note that the amorphous semiconductor refers to a semiconductor without a crystal structure (without long-range order in atomic arrangement). Note that amorphous silicon may include hydrogen or the like.

On current refers to current that flows between a source region and a drain region, that is, through a channel formation region when appropriate gate voltage is applied to a gate electrode so that current flows through the channel formation region (that is, when the thin film transistor is on). Here, an on state refers to a state where gate voltage (difference in potential between the gate electrode and the source region) exceeds threshold voltage of a transistor.

Moreover, off current refers to current that flows between a source region and a drain region, that is, through a channel formation region when gate voltage of a thin film transistor is lower than threshold voltage (that is, when the thin film transistor is off).

The plurality of microcrystalline semiconductor layers is provided apart from each other and carriers flow through the amorphous semiconductor layer in the channel formation region at a certain distance between the source region and the drain region in the channel length direction. This structure can achieve a thin film transistor with an excellent switching characteristic, that is, high on current and low off current.

The semiconductor layer with high crystallinity can be formed by provision of the silicon oxynitride layer as the insulating layer that is in contact with the microcrystalline semiconductor layer.

The silicon nitride layer is provided as the insulating layer that is in contact with the amorphous semiconductor layer and the silicon oxynitride layer is provided as the insulating layer that is in contact with the microcrystalline semiconductor layer. Thus, a thin film transistor with low subthreshold swing, threshold voltage that does not shift (or the amount of the shift is small), and favorable electrical characteristics can be formed.

DETAILED DESCRIPTION OF THE INVENTION

Figure 1A:
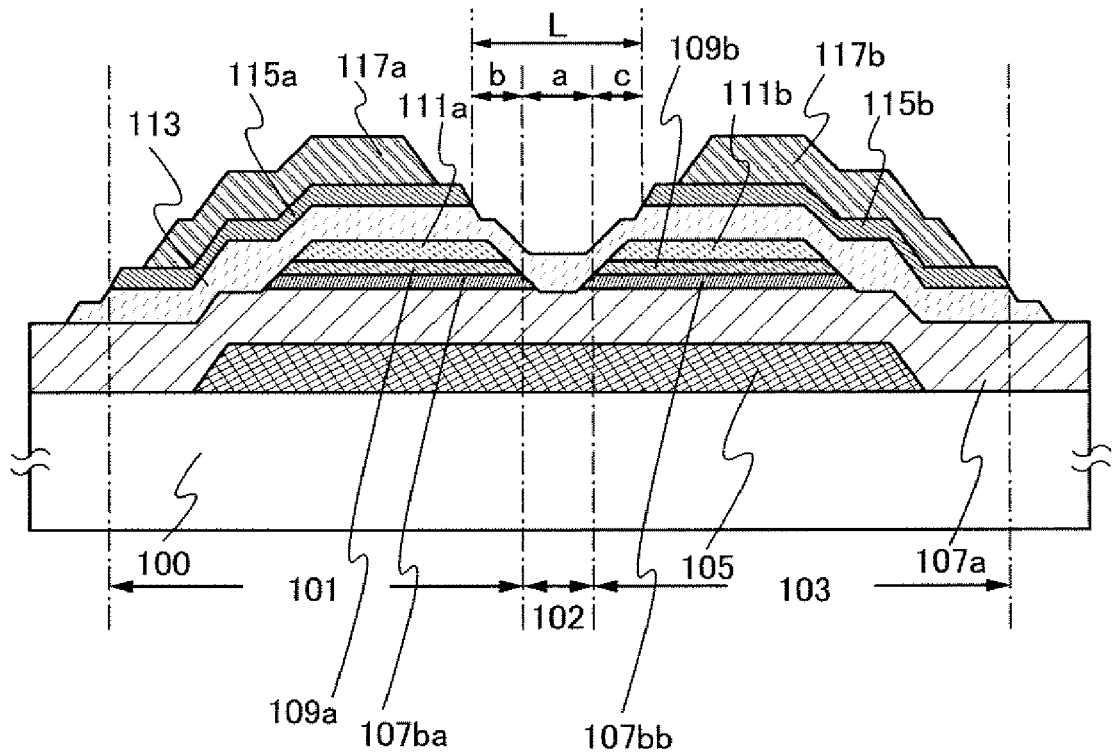
FIGS. 1A and 1B illustrate thin film transistors.

Some embodiments of the present invention will be described below with reference to the drawings. Note that the present invention is not limited to the following description because it will be easily understood by those skilled in the art that various changes and modifications can be made without departing from the concept and scope of the present invention. Note that the same reference numeral is commonly used to denote the same component among the different drawings in the structure of the present invention described below.

Embodiment 1

In Embodiment 1 an example of a structure of a thin film transistor according to an embodiment of the present invention is described with reference to FIGS. 1A and 1B.

The thin film transistor illustrated in FIG. 1A includes a gate electrode layer 105 over a substrate 100; a first insulating layer 107a over the gate electrode layer 105; second insulating layers 107ba and 107bb provided apart from each other over the first insulating layer 107a; microcrystalline semiconductor layers 109a and 109b provided apart from each other on and in contact with the second insulating layers 107ba and 107bb, respectively: and buffer layers 111a and 111b provided apart from each other over the microcrystalline semiconductor layers 109a and 109b, respectively. The buffer layer 111a, the microcrystalline semiconductor layer 109a, and the second insulating layer 107ba approximately overlap with each other. The buffer layer 111b, the microcrystalline semiconductor layer 109b, and the second insulating layer 107bb approximately overlap with each other. Moreover, an amorphous semiconductor layer 113 is provided so as to cover a side surface and a top surface of each of the second insulating layers 107ba and 107bb, the microcrystalline semiconductor layers 109a and 109b, and the buffer layers 111a and 111b. A pair of impurity semiconductor layers 115a and 115b to which an impurity element imparting one conductivity type is added is provided over the amorphous semiconductor layer 113. The impurity semiconductor layers 115a and 115b form a source region and a drain region. Further, wiring layers 117a and 117b are provided over the impurity semiconductor layers 115a and 115b.

The microcrystalline semiconductor layers 109a and 109b each preferably have an electric conductivity of 0.9 S·cm$^{-1}$ to 2 S·cm$^{-1}$.

The microcrystalline semiconductor layer is formed from a semiconductor having an intermediate structure between an amorphous structure and a crystalline structure (the crystalline structure may include a single crystal structure or a polycrystalline structure). In general, a microcrystalline semiconductor has the third state that is stable in terms of free energy, and is a crystalline semiconductor which has short-range order and lattice distortion. In the microcrystalline semiconductor, column-like or needle-like crystals each with a grain size of greater than or equal to 2 nm and less than or equal to 200 nm, preferably greater than or equal to 10 nm and less than or equal to 80 nm, and more preferably greater than or equal to 20 nm and less than or equal to 50 nm are grown in the direction of a normal line with respect to the surface of the substrate. The microcrystalline semiconductor has an electric conductivity of approximately $10^{-7}$ S·cm$^{-1}$ to $10^{-4}$ S·cm$^{-1}$ that can be increased to approximately $10^{1}$ S·cm$^{-1}$ by valence electron control. Microcrystalline silicon, which is a typical example of a microcrystalline semiconductor, has a peak of Raman spectrum which is shifted to a lower wave number side than 520 cm$^{-1}$ that represents single crystal silicon. That is to say, the peak of a Raman spectrum of microcrystalline silicon lies between 520 cm$^{-1}$ and 480 cm$^{-1}$, which represent single crystal silicon and amorphous silicon, respectively. In addition, microcrystalline silicon preferably includes hydrogen or halogen of at least 1 at. % in order to terminate a dangling bond. Moreover, when a rare gas element such as helium, argon, krypton, or neon is added to further promote lattice distortion, a favorable microcrystalline semiconductor layer with higher crystal stability can be obtained. The description of such a microcrystalline semiconductor layer is disclosed in, for example, U.S. Pat. No. 4,409,134. However, the microcrystalline semiconductor layer is not defined just by the crystal grain size and the electrical conductivity as aforementioned. A semiconductor can be regarded as the microcrystalline semiconductor as long as the semiconductor has an equivalent property value, for example, concentration of impurity element imparting one conductivity type or crystallinity.

The thickness of each of the microcrystalline semiconductor layers 109*a* and 109*b* may be greater than or equal to 5 nm and less than or equal to 50 nm, preferably greater than or equal to 5 nm and less than or equal to 30 nm.

The microcrystalline semiconductor layers 109*a* and 109*b* preferably include an impurity element serving as a donor in order to provide sufficient on current. In this case, the concentration of oxygen and the concentration of nitrogen are each preferably less than ten times that of the impurity element serving as a donor, typically less than $3 \times 10^{19}$ cm$^{-3}$, more preferably less than $3 \times 10^{18}$ cm$^{-3}$, and the concentration of carbon is preferably less than or equal to $3 \times 10^{18}$ cm$^{-3}$. This is for the purpose of suppressing defects in the microcrystalline semiconductor layer. Moreover, if oxygen or nitrogen exists in the microcrystalline semiconductor layer, crystallization of the semiconductor is interrupted. Therefore, in the case where the semiconductor layer which includes the impurity element serving as a donor is the microcrystalline semiconductor layer, the crystallinity of the microcrystalline semiconductor layer can be improved by suppressing the oxygen concentration and the nitrogen concentration of the microcrystalline semiconductor layer and by adding the impurity element serving as a donor.

Moreover, by the addition of an impurity element serving as an acceptor to the microcrystalline semiconductor layer at the same as or after the film formation of the microcrystalline semiconductor layer, the threshold voltage of the transistor can be controlled. As a typical example of the impurity element serving as an acceptor, there is boron, and an impurity gas such as $B_2H_6$ or $BF_3$ may be mixed into silicon hydride at a proportion of 1 ppm to 1000 ppm, preferably 1 ppm to 100 ppm. Further, the concentration of boron is preferably set to be about one tenth that of the impurity element serving as a donor, e.g., from $1 \times 10^{14}$ cm$^{-3}$ to $6 \times 10^{16}$ cm$^{-3}$.

The buffer layers 111*a* and 111*b* are each formed using an amorphous semiconductor. Alternatively, an amorphous semiconductor including a halogen such as fluorine or chlorine is used. The thickness of each of the buffer layers 111*a* and 111*b* may be 30 nm to 200 nm, preferably 50 nm to 150 nm. As the amorphous semiconductor, an amorphous silicon is given.

When the side surface of each of the buffer layers 111*a* and 111*b* has a tapered shape with an angle of 30° to 60° to the substrate, the microcrystalline semiconductor layer can serve as nucleus of crystal growth, so that the crystallinity of the microcrystalline semiconductor layers 109*a* and 109*b* near the interface between the microcrystalline semiconductor layers and the amorphous semiconductor layer can be improved. Therefore, high-speed operation of the thin film transistor becomes possible and on current can be increased.

When the buffer layers 111*a* and 111*b* are formed using an amorphous semiconductor layer, specifically an amorphous semiconductor layer including hydrogen, nitrogen, or halogen, native oxidation of a surface of the crystal grains of the microcrystalline semiconductor layer can be prevented. In particular, stress concentrates in a region where the amorphous semiconductor is in contact with a microcrystal grain in the microcrystalline semiconductor layer and a crack easily happens. If the crack is exposed to oxygen, the crystal grain is oxidized, so that a silicon oxide layer is formed. However, by the formation of the buffer layers 111*a* and 111*b* on the surface of the semiconductor layer including the impurity element serving as a donor, the oxidation of the microcrystal grains can be prevented. Therefore, the defects which trap carriers can be decreased and the region where the carrier movement is interrupted can be made small. Accordingly high-speed operation of the thin film transistor becomes possible and on current can be increased.

The second insulating layers 107*ba* and 107*bb* are formed from silicon oxynitride. When the second insulating layers 107*ba* and 107*bb* are formed from silicon oxynitride, the microcrystalline semiconductor layers 109*a* and 109*b* can be provided in contact with the silicon oxynitride layer; therefore, the crystallinity can be improved. Note that the thickness of each of the second insulating layers 107*ba* and 107*bb* may be 5 nm to 20 nm, preferably 10 nm to 15 nm. This is for the purpose of facilitating the control in etching and of obtaining favorable electrical characteristics.

Figure 10A:
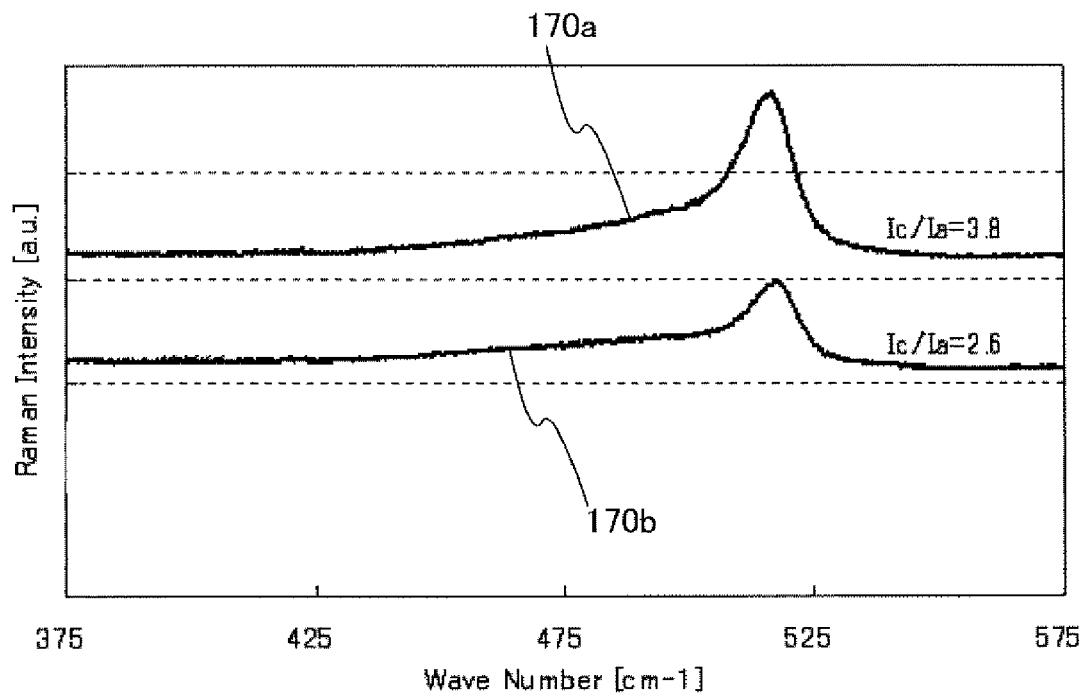
FIGS. 10A and 10B each show Raman spectra of a microcrystalline semiconductor layer of a thin film transistor.
Figure 10B:
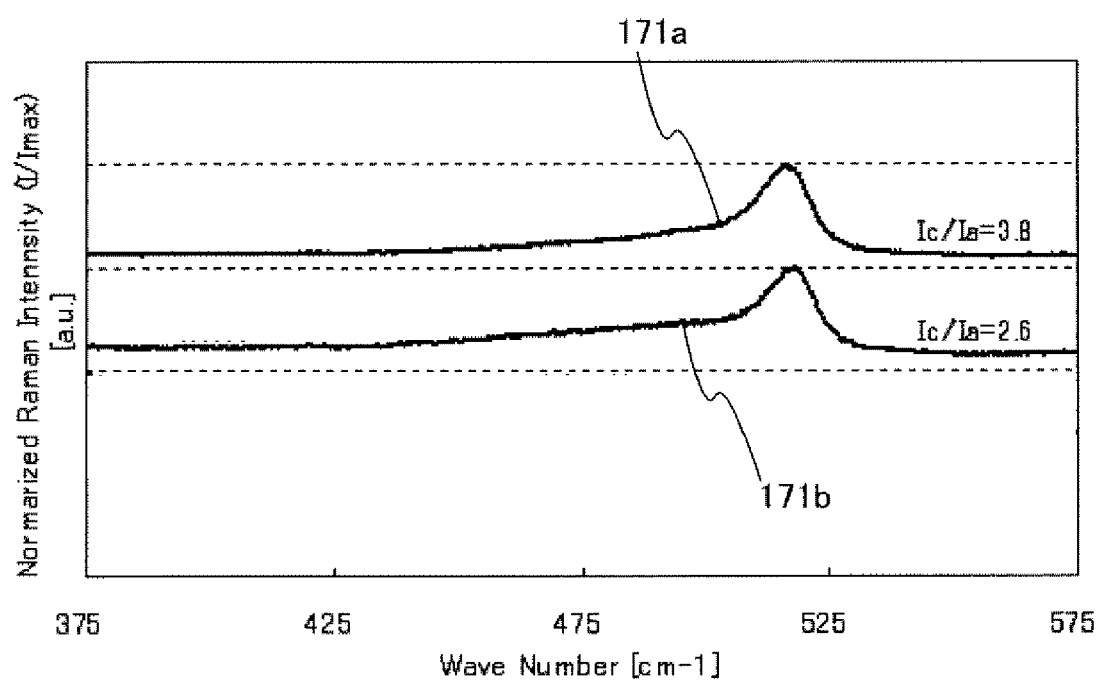

In addition, by the formation of the second insulating layers 107*ba* and 107*bb* with the use of silicon oxynitride, the crystallinity of the microcrystalline semiconductor layers 109*a* and 109*b* can be improved. FIG. 10A shows peaks of Raman spectra of the microcrystalline semiconductor layers, and FIG. 10B shows peaks of Raman spectra normalizing FIG. 10A with respect to the maximum values. Here, the microcrystalline semiconductor layer is formed without addition of the impurity element imparting one conductivity type, and the conditions except the condition for forming the layer below and in contact with the microcrystalline semiconductor layer are the same. A spectrum 170*a* and a spectrum 171*a* show the Raman peaks of microcrystalline semiconductor layers formed over a silicon oxynitride layer, and a spectrum 170*b* and a spectrum 171*b* show the Raman peaks of microcrystalline semiconductor layers formed over a silicon nitride layer.

Figure 11A:
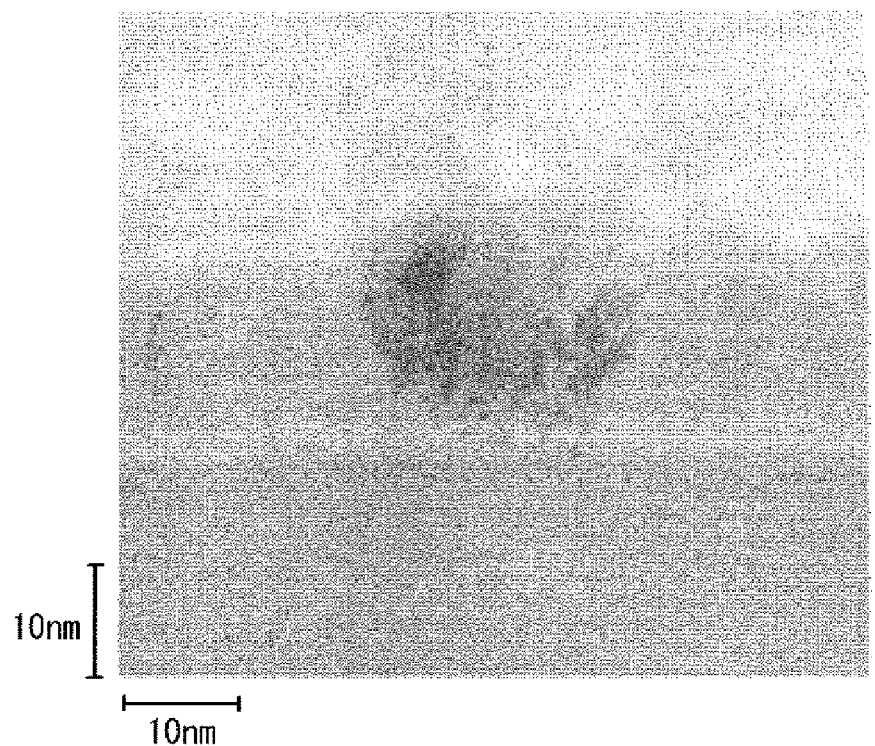
FIGS. 11A and 11B each show a TEM image along a cross section of a microcrystalline semiconductor layer of a thin film transistor.
Figure 11B:
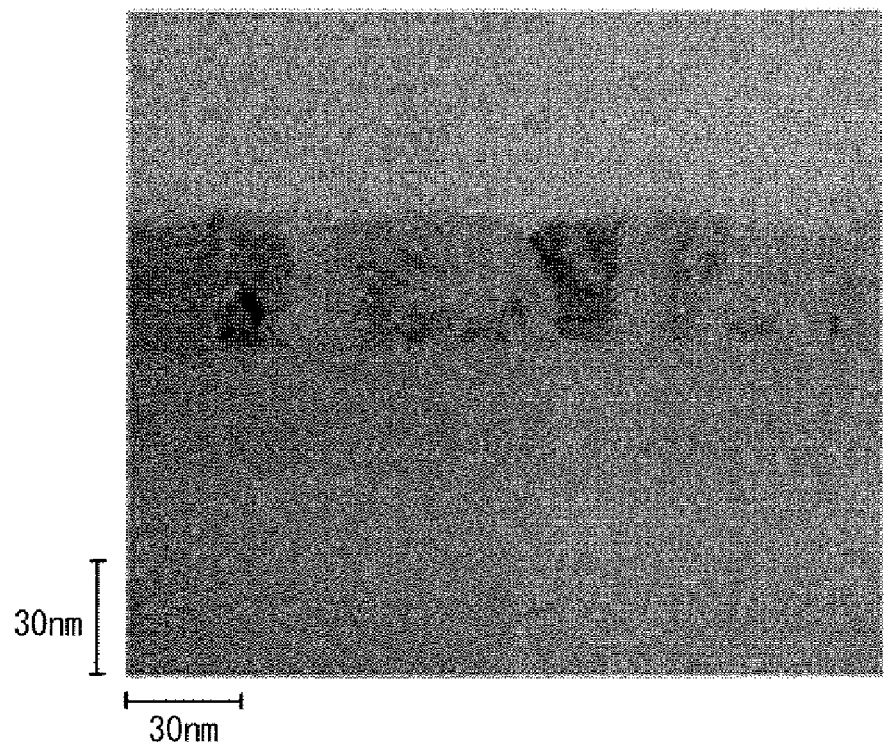

FIGS. 11A and 11B are TEM (transmission electron microscope) images along cross sections of the layers whose Raman peaks are shown in FIGS. 10A and 10B. FIG. 11A is a cross-sectional TEM image (magnification: 2,000,000) of the interface between the silicon nitride layer and the microcrystalline semiconductor layer formed over the silicon nitride layer. FIG. 11B is a cross-sectional TEM image (magnification: 1,000,000) of the interface between the silicon oxynitride layer and the microcrystalline semiconductor layer formed over the silicon oxynitride layer.

Figure 12A:
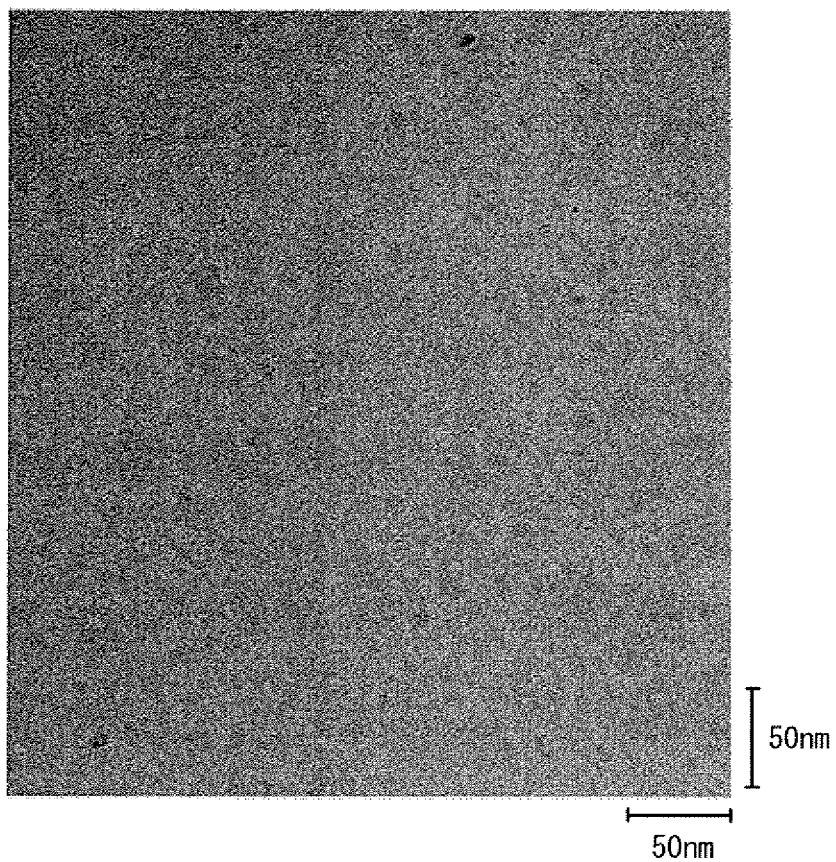
FIGS. 12A and 12B each show a TEM image of a top surface of a microcrystalline semiconductor layer of a thin film transistor.
Figure 12B:
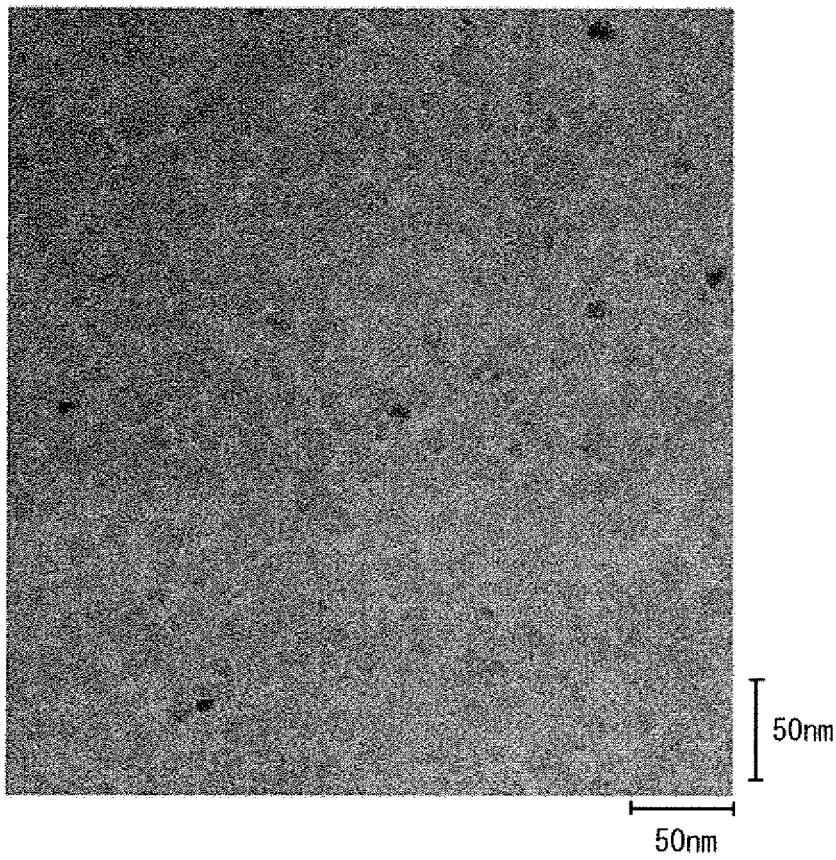

Each of FIGS. 12A and 12B is a TEM image of a top surface of the layers whose Raman peaks are shown in FIGS. 10A and 10B. FIG. 12A is a plane-view TEM image (magnification: 500,000) of the microcrystalline semiconductor layer formed over the silicon nitride layer. FIG. 12B is a plane-view TEM image (magnification: 500,000) of the microcrystalline semiconductor layer formed over the silicon oxynitride layer.

It is understood from FIGS. 10A and 10B, FIGS. 1A and 11B, and FIGS. 12A and 12B that the microcrystalline semiconductor layer formed over the silicon oxynitride layer has higher crystallinity than the microcrystalline semiconductor layer formed over the silicon nitride layer. Furthermore, it is understood from FIGS. 11A and 11B and FIGS. 12A and 12B that the microcrystalline semiconductor layer formed over the silicon oxynitride layer has crystal grains more densely than the microcrystalline semiconductor layer formed over the silicon nitride layer.

Moreover, the first insulating layer 107*a* is thick in a region where it is in contact with the second insulating layer 107*ba* or 107bb. This is because the buffer layers 111a and 111b, the microcrystalline semiconductor layers 109a and 109b, and the second insulating layers 107ba and 107bb are patterned in one etching step.

Note that silicon oxynitride means silicon that includes more oxygen than nitrogen. In the case where measurements are performed using Rutherford backscattering spectrometry (RBS) and hydrogen forward scattering (HFS), silicon oxynitride includes oxygen, nitrogen, silicon, and hydrogen at compositions ranging from 50 at. % to 70 at. %, 0.5 at. % to 15 at. %, 25 at. % to 35 at. %, and 0.1 at. % to 10 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The amorphous semiconductor layer 113 is formed using an amorphous silicon. The amorphous semiconductor layer 113 may include fluorine, chlorine, or the like. When the amorphous semiconductor layer 113 includes phosphorus, the concentration of phosphorus is preferably lower in the amorphous semiconductor layer 113 than in each of the microcrystalline semiconductor layers 109a and 109b. The part of the amorphous semiconductor layer 113 that overlaps with the wiring is greater than or equal to 50 nm and less than 500 nm in thickness.

The amorphous semiconductor layer 113 covers side surfaces of the microcrystalline semiconductor layers 109a and 109b and the buffer layers 111a and 111b. The first insulating layer 107a and the amorphous semiconductor layer 113 are in contact with each other around the microcrystalline semiconductor layers 109a and 109b. In such a structure, the microcrystalline semiconductor layers 109a and 109b are not in contact with the impurity semiconductor layers 115a and 115b. Therefore, it is possible to reduce leakage current between the microcrystalline semiconductor layers 109a and 109b and the impurity semiconductor layers 115a and 115b.

Further, when phosphorus is added to the amorphous semiconductor layer 113 at lower concentration than to the microcrystalline semiconductor layers 109a and 109b, it is possible to suppress variation in threshold voltage of transistors.

As the substrate 100, the following can be used: an alkali-free glass substrate manufactured by a fusion method or a floating method, such as a barium borosilicate glass substrate, an aluminoborosilicate glass substrate, or an aluminosilicate glass substrate; a ceramic substrate; a plastic substrate with heat resistance that can resist process temperature of this manufacturing process; or the like. Alternatively, a metal substrate such as a stainless alloy, whose surface is provided with an insulating layer, may be applied. When the substrate 100 is a mother glass, the substrate may have any of the following sizes: the 1st generation (320 mm×400 mm), the 2nd generation (400 mm×500 mm), the 3rd generation (550 mm×650 mm), the 4th generation (680 mm×880 mm or 730 mm×920 mm), the 5th generation (1000 mm×1200 mm or 1100 mm×1250 mm), the 6th generation (1500 mm×1800 mm), the 7th generation (1900 mm×2200 mm), and the 8th generation (2160 mm×2460 mm). Moreover, substrates of the 9th generation (2400 mm×2800 mm or 2450 mm×3050 mm) and the 10th generation (2950 mm×3400 mm) can be used.

The gate electrode layer 105 is preferably formed from a conductive material, for example a metal material. As examples of the metal material that can be used, there are aluminum, chromium, titanium, tantalum, molybdenum, copper, and the like. The gate electrode layer 105 is preferably formed using, for example, aluminum or a stack in which aluminum is sandwiched between barrier metals. As the barrier metal, refractory metal such as titanium, molybdenum, or chromium is used. The barrier metal is provided for the purpose of preventing hillock and oxidation of aluminum.

The gate electrode layer 105 is preferably formed in thickness greater than or equal to 50 nm and less than or equal to 300 nm for forming a gate wiring. The thickness of greater than or equal to 50 nm and less than or equal to 100 nm of the gate electrode layer 105 can prevent disconnection due to a step of semiconductor layers and wirings, which are formed later. Further, the thickness of greater than or equal to 150 nm and less than or equal to 300 nm of the gate electrode layer 105 can lower the resistance of the gate wiring and increase the area thereof.

An end portion of the gate electrode layer 105 is preferably processed to have a tapered shape in order to prevent the disconnection due to a step, because semiconductor layers and insulating layers are provided over the gate electrode layer 105. Note that the gate electrode layer 105 can be used for forming not only the gate wiring but also a capacitor wiring.

The first insulating layer 107a is formed from silicon nitride. The use of the silicon nitride for the first insulating layer 107a offers the following advantages. First, the subthreshold swing of the thin film transistor can be decreased because the first insulating layer 107a serves as a gate insulating layer with respect to the amorphous semiconductor layer 113. Moreover, impurity elements such as sodium in the substrate 100 can be prevented from entering the microcrystalline semiconductor layers 109a and 109b, the buffer layers 111a and 111b, and the amorphous semiconductor layer 113. Furthermore, oxidation of the gate electrode layer 105 can be prevented.

The first insulating layer 107a is formed preferably to a thickness of 50 nm to 150 nm. The gate electrode layer 105, which is generally formed by a sputtering method, tends to have an uneven surface. However, by the use of the first insulating layer 107a with a thickness of 50 nm to 150 nm, the decrease in coverage due to this unevenness can be relieved.

Therefore, when the first insulating layer 107a is formed from silicon nitride to a thickness of 50 nm to 150 nm, the electrical characteristics of a thin film transistor to be completed later can be improved.

In the case of forming an n-channel thin film transistor, for example, phosphorus may be added as the impurity element of the pair of impurity semiconductor layers 115a and 115b; in this case, an impurity gas such as $PH_3$ may be added to silicon hydride that is used for forming the impurity semiconductor layers 115a and 115b. In the case of forming a p-channel thin film transistor, for example, boron may be added as an impurity element; in this case, an impurity gas such as $B_2H_6$ may be added to silicon hydride that is used for forming the impurity semiconductor layers 115a and 115b. When phosphorus or boron is added at a concentration of $1\times10^{19}$ to $1\times10^{21}$ $cm^{-3}$, the impurity semiconductor layers 115a and 115b can have ohmic contact with the wiring layers 117a and 117b, so that the impurity semiconductor layers 115a and 115b can serve as a source region and a drain region. The pair of impurity semiconductor layers 115a and 115b can be formed from a microcrystalline semiconductor or an amorphous semiconductor. The pair of impurity semiconductor layers 115a and 115b is formed to a thickness of greater than or equal to 10 nm and less than or equal to 100 nm, preferably greater than or equal to 30 nm and less than or equal to 50 nm. By the decrease in thickness of the pair of impurity semiconductor layers 115a and 115b, the throughput at the time of formation is improved.

The wiring layers 117a and 117b may be formed from a conductive material, for example a metal material. For example, a single layer or a stack of layers of aluminum, aluminum including an element which improves heat resistance, or aluminum including an element which prevents hillock (hereinafter the latter two aluminum is called aluminum alloy) is preferably used. Here, as examples of the element which improves heat resistance or the element which prevents hillock, there are copper, silicon, titanium, neodymium, scandium, molybdenum, and the like. Alternatively, another stacked-layer structure may be employed in which a layer which is in contact with the impurity semiconductor layers is formed using titanium, tantalum, molybdenum, tungsten, or nitride of any of these elements, and a layer formed using aluminum or an aluminum alloy is stacked thereover. Further alternatively, another stacked-layer structure may be employed in which an upper surface and a lower surface of a layer of aluminum or an aluminum alloy are sandwiched between titanium, tantalum, molybdenum, tungsten, or a nitride of any of these elements. For example, a stack of conductive layers in which an aluminum layer is provided over a titanium layer and another titanium layer is provided over the aluminum layer can be used.

Note that the aforementioned materials for forming the gate electrode layer 105 can be used for the wiring layer 117a and the aforementioned materials for forming the wiring layers 117a and 117b can be used for the gate electrode layer 105.

Further, in the thin film transistor illustrated in FIG. 1A, the amorphous semiconductor layer 113 is not in contact with the wiring layers 117a and 117b and the wiring layers 117a and 117b are provided over the buffer layers 111a and 111b with the pair of impurity semiconductor layers 115a and 115b interposed therebetween. Alternatively, the side surface of the amorphous semiconductor layer 113 may be in contact with the wiring layers 117a and 117b as illustrated in FIG. 1B.

In this embodiment, a first thin film transistor 101, a second thin film transistor 102, and a third thin film transistor 103 are connected to each other in series to form the thin film transistor. The first thin film transistor 101 includes the gate electrode layer 105, the first insulating layer 107a, the second insulating layer 107ba, the microcrystalline semiconductor layer 109a, the buffer layer 111a, the amorphous semiconductor layer 113, the impurity semiconductor layer 115a, and the wiring layer 117a. The second thin film transistor 102 includes the gate electrode layer 105, the first insulating layer 107a, and the amorphous semiconductor layer 113. The third thin film transistor 103 includes the gate electrode layer 105, the first insulating layer 107a, the second insulating layer 107bb, the microcrystalline semiconductor layer 109b, the buffer layer 111b, the amorphous semiconductor layer 113, the impurity semiconductor layer 115b, and the wiring layer 117b.

In the second thin film transistor 102, an amorphous semiconductor layer is used for a channel formation region. In the first thin film transistor 101 and the third thin film transistor 103, the microcrystalline semiconductor layer 109a and the microcrystalline semiconductor layer 109b correspond to carrier flowing regions, respectively. Each of the microcrystalline semiconductor layers 109a and 109b has an electric conductivity of 0.9 to 2 S·cm$^{-1}$ and has lower resistivity than normal amorphous semiconductor layer and microcrystalline semiconductor layer. Therefore, even while a positive voltage below the threshold voltage of the second thin film transistor 102 is applied to the gate electrode layer 105, a number of carriers are induced in the microcrystalline semiconductor layers 109a and 109b. When a positive voltage greater than or equal to the threshold voltage of the second thin film transistor 102 is applied to the gate electrode layer 105, the second thin film transistor 102 is turned on, so that the carriers induced in the microcrystalline semiconductor layers 109a and 109b flow through the wiring layer 117a of the first thin film transistor 101 and the wiring layer 117b of the third thin film transistor 103.

When the distance between the microcrystalline semiconductor layers 109a and 109b is "a", the distance between an end of the impurity semiconductor layer 115a and an end of the microcrystalline semiconductor layer 109a is "b", and the distance between the impurity semiconductor layer 115b and the microcrystalline semiconductor layer 109b is "c", the channel length L of the thin film transistor of this embodiment is the sum of a, b, and c. The on current and field effect mobility increase when the distance "a" between the microcrystalline semiconductor layers 109a and 109b is shortened, the distance "b" between the end of the impurity semiconductor layer 115a and the end of the microcrystalline semiconductor layer 109a is lengthened, and the distance "c" between the impurity semiconductor layer 115b and the microcrystalline semiconductor layer 109b is lengthened, relative to the channel length L.

In the thin film transistor of this embodiment, the microcrystalline semiconductor layers 109a and 109b are etched with the use of a resist mask formed using the same photomask. Therefore, it is unnecessary to align the photomasks with submicron accuracy; thus, variation in the distance "a" between the microcrystalline semiconductor layers 109a and 109b can be made very small, which is about the resolution limit of a light-exposure apparatus. Further, by the use of a phase shift mask, the distance can be made less than or equal to the resolution limit of the light-exposure apparatus. The region between the microcrystalline semiconductor layers 109a and 109b serves as the channel formation region of the second thin film transistor 102 when a positive gate voltage is applied. Since the variation can be decreased as above, the variation in electrical characteristics of transistors within the substrate surface can be decreased.

Note that the channel length (that is, the distance "a") of the second thin film transistor 102 can be shortened by using, for example, a phase shift mask. In order to shorten the distance "a", the first insulating layer 107a which serves as the gate insulating layer may be formed thin so as not to cause a short channel effect in the second thin film transistor 102.

On the other hand, when a negative voltage is applied to the gate electrode layer 105, the second thin film transistor 102 is off even though carriers are induced in the microcrystalline semiconductor layers 109a and 109b; thus, current flow can be interrupted. The second thin film transistor 102 is formed using the amorphous semiconductor layer and a leakage path and the like do not appear in the second thin film transistor 102; therefore, off current can be decreased.

As described above, the thin film transistor with high on current, high field effect mobility, and low off current can be obtained. Moreover, as for the thin film transistor in this embodiment, the subthreshold swing is low, the threshold voltage does not shift or the amount of the shift is small, and the electrical characteristics are favorable.

The surface (back channel) of the amorphous semiconductor layer 113 that connects the source region and the drain region has an uneven shape, so that the distance between the source region and the drain region becomes long. Therefore, the path of leakage current flowing on the surface of the amorphous semiconductor layer 113 between the source region and the drain region is lengthened. Thus, the leakage current flowing on the surface of the amorphous semiconductor layer 113 between the source region and the drain region can be decreased so as to reduce the off current.

In addition to the insulating layer, the amorphous semiconductor layer 113 is provided between the gate electrode layer 105 and the impurity semiconductor layers 115a and 115b. Therefore, there is a long distance between the gate electrode layer 105 and the impurity semiconductor layers 115a and 115b. As a result, the parasitic capacitance caused between the gate electrode layer 105 and the impurity semiconductor layers 115a and 115b can be decreased.

Embodiment 2

This embodiment will describe a process for manufacturing the thin film transistor illustrated in FIG. 1A, with reference to FIG. 2, FIGS. 3A to 3E, FIGS. 4A to 4E, and FIGS. 5A and 5B.

An n-channel thin film transistor having an amorphous semiconductor layer or a microcrystalline semiconductor layer is more suitable for use in a driver circuit than a p-channel one because the former has higher field effect mobility than the latter. Moreover, it is preferable that all the thin film transistors formed over one substrate have the same conductivity type because the number of manufacturing steps is decreased. In view of this, this embodiment describes a process for manufacturing an n-channel thin film transistor. Note that a p-channel thin film transistor can be manufactured in a similar manner.

First, the process for manufacturing the thin film transistor illustrated in FIG. 1A is described with reference to FIG. 2, FIGS. 3A to 3E, FIGS. 4A to 4E, and FIGS. 5A and 5B. FIGS. 3A to 3E are cross-sectional views along A-B of FIG. 2, while FIGS. 4A to 4E are cross-sectional views along C-D of FIG. 2.

Figure 3A:
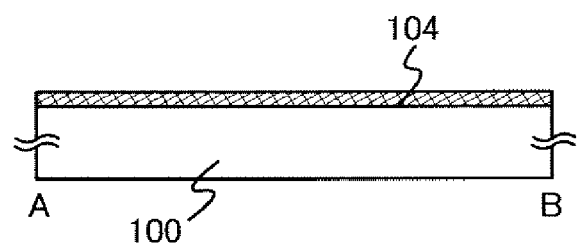
FIGS. 3A to 3E illustrate a method for manufacturing thin film transistors.
Figure 4A:
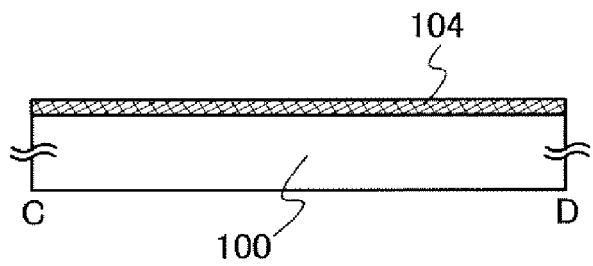
FIGS. 4A to 4E illustrate a method for manufacturing a thin film transistor.

First, a conductive layer 104 is formed over the substrate 100 (see FIG. 3A and FIG. 4A). The conductive layer 104 can be formed from any of the materials for the gate electrode layer 105 which are given in Embodiment 1. The conductive layer 104 is formed by a sputtering method, a CVD method, a plating method, a printing method, a droplet discharging method, or the like.

After a resist is applied to the conductive layer 104, a resist mask is formed through a photolithography process using a first photomask. The conductive layer 104 is etched into a desired shape using this resist mask, thereby forming the gate electrode layer 105. After that, the resist mask is removed.

Next, the first insulating layer 107a is formed over the substrate 100 and the gate electrode layer 105. The first insulating layer 107a can be formed from silicon nitride in a manner similar to Embodiment 1. The first insulating layer 107a is formed by a CVD method, a sputtering method, or the like.

Figure 3B:
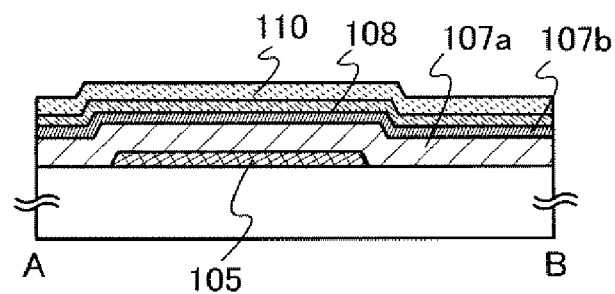
Figure 3C:
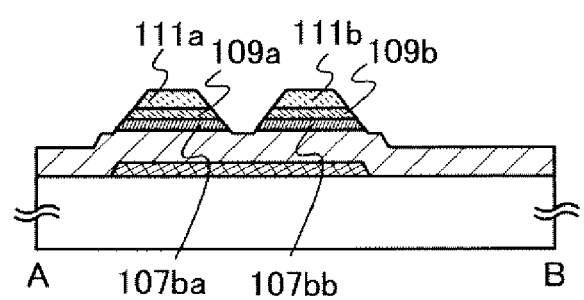
Figure 4B:
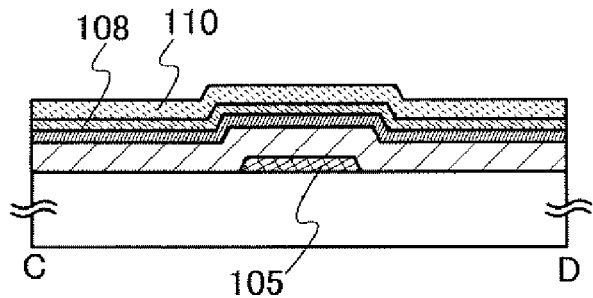
Figure 4C:
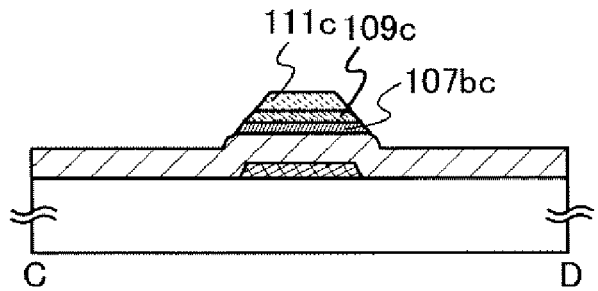

Next, the second insulating layer 107b, the microcrystalline semiconductor layer 108, and the buffer layer 110 are stacked over the first insulating layer 107a (see FIG. 3B and FIG. 4B). The microcrystalline semiconductor layer 108 preferably includes an impurity element which serves as a donor, in a manner similar to Embodiment 1. A method of forming the microcrystalline semiconductor layer 108 is described below.

The microcrystalline semiconductor layer 108 is formed using glow discharge plasma in a reaction chamber of a plasma CVD apparatus with the use of a mixture of hydrogen and a deposition gas including silicon. With the mixture in which the flow rate of hydrogen is 10 to 2000 times, preferably 50 to 200 times that of the deposition gas including silicon, the microcrystalline semiconductor layer can be formed. The temperature for heating the substrate is from 100° C. to 300° C., preferably from 120° C. to 220° C. Alternatively, when a gas including phosphorus, arsenic, antimony, or the like is mixed with the aforementioned source gas, the impurity element serving as a donor can be added.

Here, phosphine is added to a mixed gas including silane, hydrogen, and a rare gas (or a mixed gas including silane and one of hydrogen and a rare gas) and glow discharge plasma is used, whereby a microcrystalline silicon layer including phosphorus is formed.

Here, the glow discharge plasma is generated by applying a high-frequency electric power of 1 MHz to 20 MHz (typically 13.56 MHz) or a high-frequency electric power of more than 20 MHz up to approximately 120 MHz (typically 27.12 Mhz or 60 MHz).

As typical examples of the deposition gas including silicon, there are $SiH_4$, $Si_2H_6$, and the like.

The impurity element serving as a donor may be added to the second insulating layer 107b instead of being added directly to the microcrystalline semiconductor layers 109a and 109b. Alternatively, the impurity element serving as a donor may be added to the first insulating layer 107a. Further alternatively, the impurity element serving as a donor may be added to both the first insulating layer 107a and the second insulating layer 107b.

Alternatively, the impurity element serving as a donor may be added at the time of forming the microcrystalline semiconductor layers 109a and 109b and moreover the impurity element serving as a donor may be added to the first insulating layer 107a and the second insulating layer 107b.

In the case of forming the first insulating layer 107a which includes the impurity element serving as a donor, a mixed gas may be used which includes the impurity element serving as a donor and a source gas used for forming an insulating layer, For example, silicon nitride including phosphorus can be formed by a plasma CVD method using silane, ammonia, and phosphine. Further, in the case of forming the second insulating layer 107b which includes the impurity element serving as a donor, a silicon oxynitride layer including phosphorus can be formed by a plasma CVD method using silane, dinitrogen monoxide, ammonia, and phosphine.

Alternatively, a gas including the impurity element serving as a donor may be supplied to the reaction chamber of the apparatus prior to the formation of these layers, so that the impurity element serving as a donor is stuck to the surface of the substrate 100 and the inner wall of the reaction chamber. After that, the layers are formed, whereby the semiconductor layer can be formed while taking in the impurity element serving as a donor.

Further, the surface of the second insulating layer 107b is preferably subjected to plasma process. This process can be performed in such a manner that the surface of the second insulating layer 107b is exposed to plasma typified by hydrogen plasma, ammonia plasma, $H_2O$ plasma, helium plasma, argon plasma, or neon plasma. As a result, the number of defects of the surface of the second insulating layer 107b can be decreased. This is because the dangling bond on the surface of the second insulating layer 107b can be terminated due to this process.

Next, the buffer layer 110 is formed. The buffer layer 110 is formed using an amorphous semiconductor layer. The amorphous semiconductor layer may be formed by a plasma CVD method using a deposition gas including silicon. Alternatively, the amorphous semiconductor layer can be formed using a deposition gas including silicon which is diluted with one or more kinds of rare gas elements selected from helium, argon, krypton, and neon. When the flow rate of hydrogen is 0 to 50 times, preferably 0 to 10 times, more preferably 2 to 5 times that of the deposition gas including silicon, the amorphous semiconductor layer can be formed. More specifically, when the flow rate of hydrogen is 1 to 10 times, preferably 1 to 5 times that of a silane gas, an amorphous semiconductor layer including hydrogen can be formed. Further, a halogen such as fluorine or chlorine may be added to the gas.

The amorphous semiconductor layer can be formed by performing sputtering in hydrogen or a rare gas using a silicon target.

The buffer layer 110 is formed preferably by a plasma CVD method at a temperature of 300° C. to 400° C. Through this process, hydrogen is supplied to the microcrystalline semiconductor layer 108 and the effect similar to hydrogenation of the microcrystalline semiconductor layer 108 can be obtained. That is to say, when the buffer layer 110 is formed under the above condition over the semiconductor layer including the impurity element serving as a donor, hydrogen can be diffused to the microcrystalline semiconductor layer 108 to terminate the dangling bond.

By the provision of the buffer layer 110, native oxidation of the surface of crystal grains in the microcrystalline semiconductor layer can be prevented. The buffer layer 110 may include hydrogen, nitrogen, or halogen. In particular, local stress easily causes a crack in a region where the amorphous semiconductor layer and the crystal grain of the microcrystalline semiconductor layer are in contact with each other. If the crack is exposed to oxygen, the crystal grain is oxidized, so that silicon oxide is formed. However, by the provision of the buffer layer 110, the oxidation of the microcrystal grains of the microcrystalline semiconductor layer can be prevented. Furthermore, when the thickness of the buffer layer 110 is increased, the withstanding voltage of the thin film transistor is also increased; therefore, it is possible to prevent the thin film transistor from deteriorating due to high voltage.

After a resist is applied to the buffer layer 110, a resist mask is formed through a photolithography process using a second photomask. With the use of this resist mask, the buffer layer 110 and the microcrystalline semiconductor layer 108 are etched into a desired shape. Thus, the second insulating layers 107ba and 107bb which are apart from each other, the microcrystalline semiconductor layers 109a and 109b which are apart from each other, and the buffer layers 111a and 111b which are apart from each other are provided in a region where the thin film transistor is formed (see FIG. 3C and FIG. 4C). After that, the resist mask is removed.

After the resist mask is removed, the second insulating layer 107b is etched using the buffer layers 111a and 111b as masks, thereby forming the second insulating layers 107ba and 107bb. In this step, part of the first insulating layer 107a that does not overlap with the buffer layers 111a and 111b is also etched in addition to the second insulating layer 107b.

Next, an amorphous semiconductor layer 112 and an impurity semiconductor layer 114 including an impurity element imparting one conductivity type are formed.

The amorphous semiconductor layer 112 can be formed using a material and a method which are similar to those of the buffer layer 110.

The amorphous semiconductor layer 112 is formed as follows: the inner wall of a chamber of a plasma CVD apparatus is pre-coated with any of a silicon nitride oxide layer, a silicon nitride layer, a silicon oxide layer, and a silicon oxynitride layer; then a semiconductor layer is formed with the flow rate of hydrogen 0 to 50 times, preferably 0 to 10 times, and more preferably 2 to 5 times that of a deposition gas including silicon. Then, the semiconductor layer is formed while taking in oxygen, nitrogen, and the like existing in the inner wall of the chamber; therefore, a dense amorphous semiconductor layer can be formed without being crystallized. However, part of the amorphous semiconductor layer 112 may include microcrystal grains.

In this embodiment, the n-channel thin film transistor is formed. Therefore, the impurity semiconductor layer 114 including the impurity element imparting one conductivity type can be formed by a plasma CVD method using phosphine and a deposition gas including silicon. In the case of forming a p-channel thin film transistor, a plasma CVD method using diborane and a deposition gas including silicon can be used.

In the steps of forming the microcrystalline semiconductor layer 108, the buffer layer 110, the amorphous semiconductor layer 112, and the impurity semiconductor layer 115a, the glow discharge plasma can be generated by applying a high-frequency electric power of 1 MHz to 20 MHz (typically 13.56 MHz) or a high-frequency electric power of more than 20 MHz up to approximately 120 MHz (typically 27.12 MHz or 60 MHz).

A conductive layer 116 can be formed from any of the materials for the wiring layers 117a and 117b which are given in Embodiment 1. The conductive layer 116 is formed by a CVD method, a sputtering method, a printing method, a drop-let discharging method, or the like. Although the conductive layer 116 is formed as a single layer in FIGS. 3D and 3E, a plurality of conductive layers may be stacked to form the conductive layer 116 in a manner similar to Embodiment 1.

Then, a resist is applied to the conductive layer 116. As the resist, a positive type resist or a negative type resist can be used. Here, the case of using a positive type resist is described.

Figure 3D:
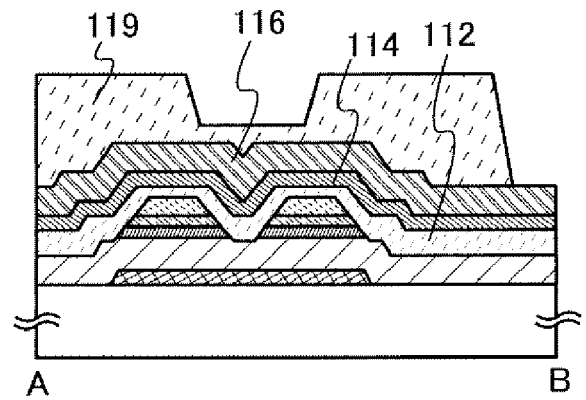
Figure 4D:
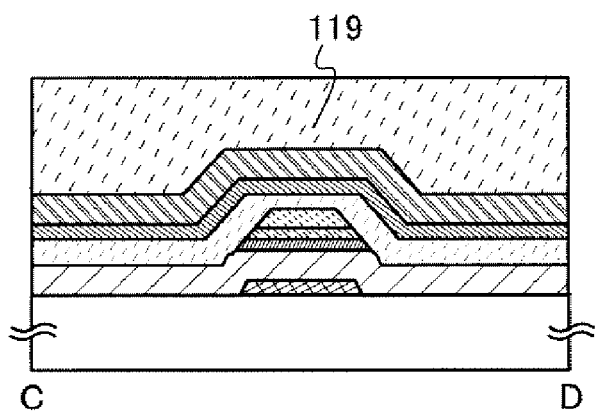
Figure 4E:
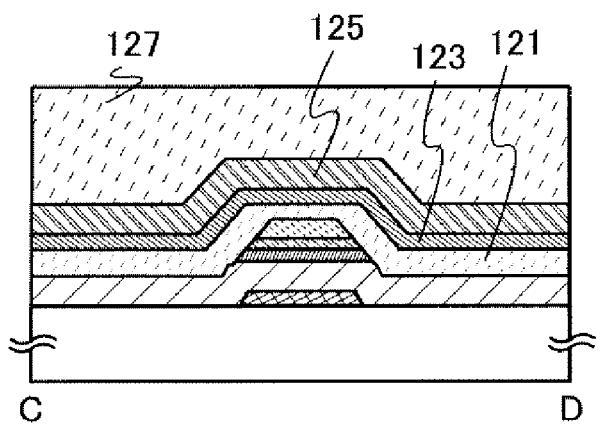

Next, the resist is irradiated with light with the use of a multitone mask as a third photomask and then developed, thereby forming a resist mask 119 (see FIG. 3D and FIG. 4D).

The resist mask 119 can be formed using a general multitone mask. Here, a multitone mask is described below with reference to FIGS. 5A and 5B.

A multitone mask allows light exposure with multilevel amount of light. Typically, the light exposure can be performed with three levels of amount of light to form a light-exposed region, a semi-light-exposed region, and a non-light-exposed region. By one light exposure and development step with the use of a multitone mask, a resist mask with plural thicknesses (typically, two kinds of thicknesses) can be formed. Thus, the use of a multitone mask can reduce the number of photomasks.

Figure 5A:
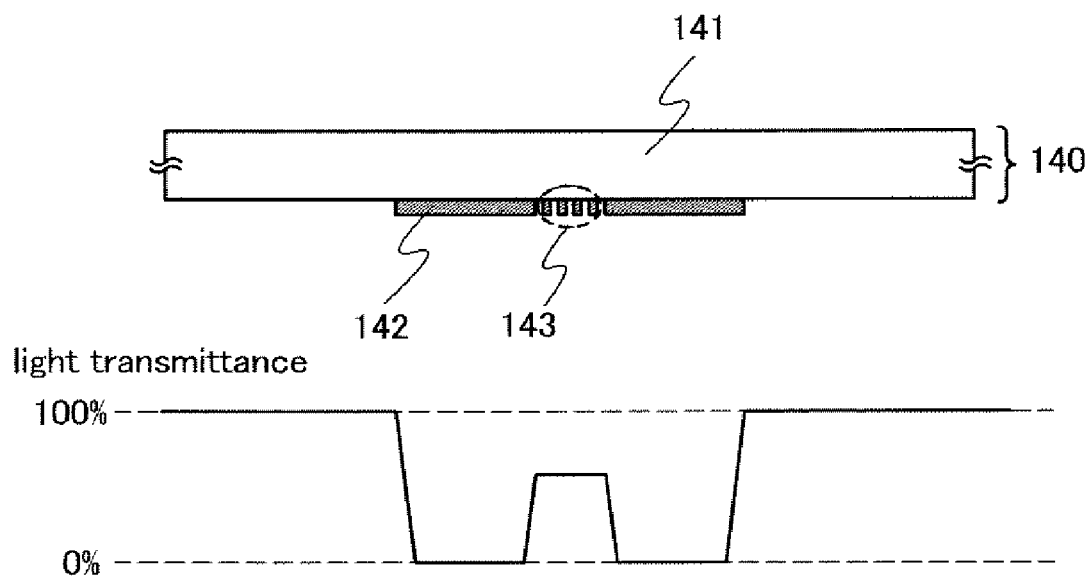
FIGS. 5A and 5B each illustrate a method for manufacturing a thin film transistor.
Figure 5B:
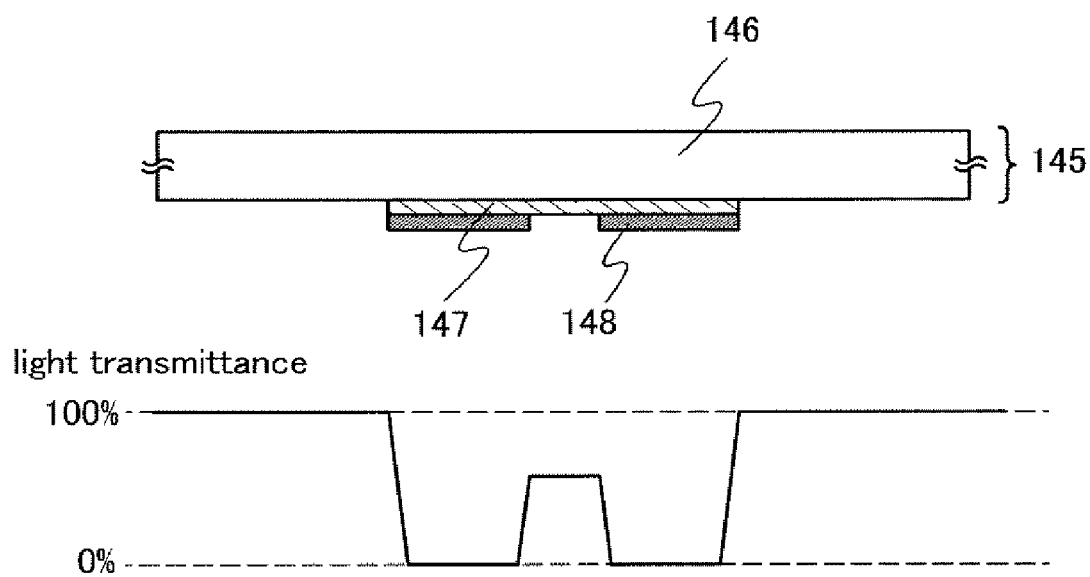
Figure 6:
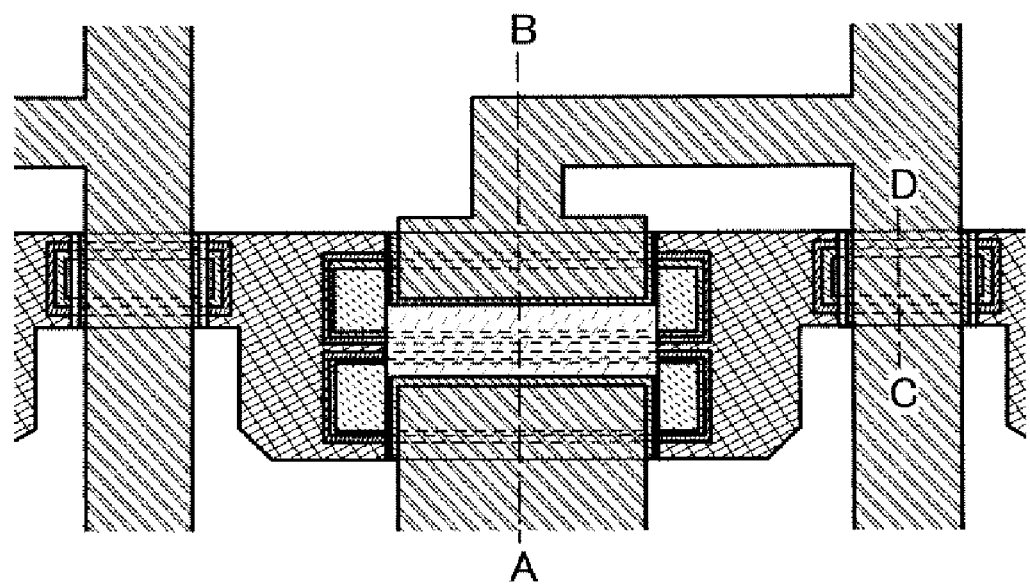
FIG. 6 illustrates a method for manufacturing thin film transistors.

FIGS. 5A and 5B are cross-sectional views of typical multitone masks. FIG. 5A illustrates a graytone mask 140 and FIG. 5B illustrates a halftone mask 145.

The graytone mask 140 in FIG. 5A includes a light-blocking portion 142 formed using a light-blocking film and a diffraction grating portion 143 formed by a pattern of the light-blocking film that are provided over a substrate 141 having a light-transmitting property.

The diffraction grating portion 143 has slits, dots, meshes, or the like that are provided at intervals which are less than or equal to the resolution limit of light used for the exposure, whereby the light transmittance can be controlled. Note that the diffraction grating portion 143 may have slits, dots, or meshes with periodic or nonperiodic intervals.

For the substrate 141 having a light-transmitting property, quartz or the like can be used. The light-blocking film for the light-blocking portion 142 and the diffraction grating portion 143 may be formed using a metal film; preferably, chromium, chromium oxide, or the like is used.

When the graytone mask 140 is irradiated with light for the exposure, the light transmittance of a region overlapping with the light-blocking portion 142 is 0% and that of a region where neither the light-blocking portion 142 nor the diffraction grating portion 143 is provided is 100%, as illustrated in FIG. 5A. Further, the light transmittance of the diffraction grating portion 143 is approximately 10% to 70%, which can be adjusted by the control of the intervals or the like of the slits, dots, or meshes of the diffraction grating.

The halftone mask 145 illustrated in FIG. 5B includes a semi-light-transmitting portion 147 formed using a semi-light-transmitting film and a light-blocking portion 148 formed using a light-blocking film which are provided over a substrate 146 having a light-transmitting property.

The semi-light-transmitting portion 147 can be formed using a film of MoSiN, MoSi, MoSiO, MoSiON, CrSi, or the like. The light-blocking portion 148 may be formed using a metal film similar to the light-blocking film of the graytone mask; preferably, chromium, chromium oxide, or the like is used.

When the halftone mask 145 is irradiated with light for the exposure, the light transmittance of a region overlapping with the light-blocking portion 148 is 0% and that of a region where neither the light-blocking portion 148 nor the semi-light-transmitting portion 147 is provided is 100%, as illustrated in FIG. 5B. Further, the light transmittance of the semi-light-transmitting portion 147 is approximately 10% to 70%, which can be adjusted by the control of the kind of material, the thickness, or the like thereof.

After the light exposure using the multitone mask is performed, development is carried out, whereby a resist mask having regions with different thicknesses can be formed.

Next, the amorphous semiconductor layer 112, the impurity semiconductor layer 114 including the impurity imparting one conductivity type, and the conductive layer 116 are etched away with the use of the resist mask 119. As a result, an amorphous semiconductor layer 121, an impurity semiconductor layer 123 including an impurity imparting one conductivity type, and a conductive layer 125 can be formed (see FIG. 3E and FIG. 4E).

Figure 3E:
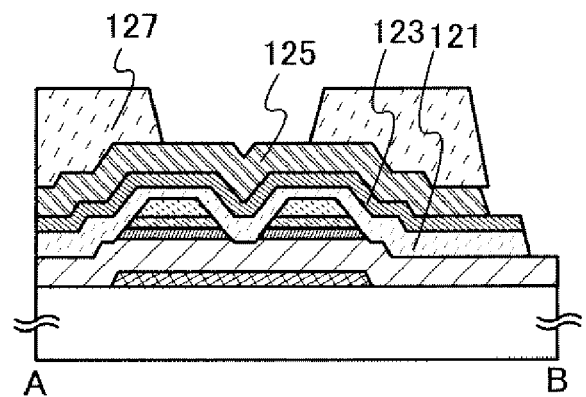

Next, ashing is performed on the resist mask 119. Due to the ashing performed on the resist mask 119, the area of the resist mask and the thickness thereof are decreased. At this time, the resist in a region with small thickness (a region overlapping with part of the gate electrode layer 105) is removed to form separated resist masks 127, as illustrated in FIG. 3E.

Next, the conductive layer 125 is etched to be separated with the use of the resist masks 127, whereby the wiring layers 117a and 117b can be formed. When the etching of the conductive layer 125 with the use of the resist masks 127 is wet etching, the end of the conductive layer 125 is etched as selected. As a result, the wiring layers 117a and 117b each with a smaller area than the resist mask 127 can be formed.

At the intersection of the gate electrode layer 135 and the wiring layer 117a (at the position of the cross section along C-D in FIG. 2), a second insulating layer 107bc, a microcrystalline semiconductor layer 109c, a buffer layer 111c, and the amorphous semiconductor layer 121 are formed in addition to the first insulating layer 107a. Thus, the distance between the gate electrode layer 105 and the wiring layer 117a can be lengthened. Therefore, the parasitic capacitance in a region where the gate electrode layer 105 intersects with the wiring layer 117a can be decreased. FIGS. 4A to 4E illustrate a process for manufacturing a portion where the gate electrode layer 105 intersects with the wiring layer 117a.

Next, the impurity semiconductor layer 123 including the impurity element imparting one conductivity type is etched with the use of the resist masks 127 so as to form the pair of impurity semiconductor layers 115a and 115b. Note that part of the amorphous semiconductor layer 121 is also etched in this etching step, thereby forming the amorphous semiconductor layer 113.

Here, the ends of the wiring layers 117a and 117b do not align with the ends of the impurity semiconductor layers 115a and 115b but the ends of the impurity semiconductor layers 115a and 115b are located outside of the ends of the wiring layers 117a and 117b. After that, the resist masks 127 are removed.

After the removal of the resist masks 127, $H_2O$ plasma treatment is preferably performed. The $H_2O$ plasma treatment can be performed typically in such a manner that radicals are generated by discharging vaporized water in plasma and a surface to be irradiated is irradiated with the radicals. When the $H_2O$ plasma treatment is performed on the amorphous semiconductor layer 113, the pair of impurity semiconductor layers 115a and 115b, and the wiring layers 117a and 117b, the thin film transistor can operate at high speed and the on current thereof can be further increased. Furthermore, the off current can be decreased.

In accordance with these steps, the thin film transistor as illustrated in FIG. 1A can be manufactured. The thin film transistor manufactured in the aforementioned manner has low off current and high on current and can operate at high speed. Further, an element substrate including the thin film transistor as a switching element of a pixel electrode can be manufactured. In this embodiment, the conductive layer and the buffer layer are etched into predetermined shapes; therefore, the number of photomasks that are used is increased by one as compared with a process for manufacturing a general inverted-staggered thin film transistor. However, a multitone mask is used as the photomask in etching the amorphous semiconductor layer, the impurity semiconductor layer, and the wiring layer into predetermined shapes; therefore, as a whole, the thin film transistor can be manufactured without increasing the number of masks as compared with the process for manufacturing a conventional thin film transistor that does not use a multitone mask.

Embodiment 3

Figure 1B:
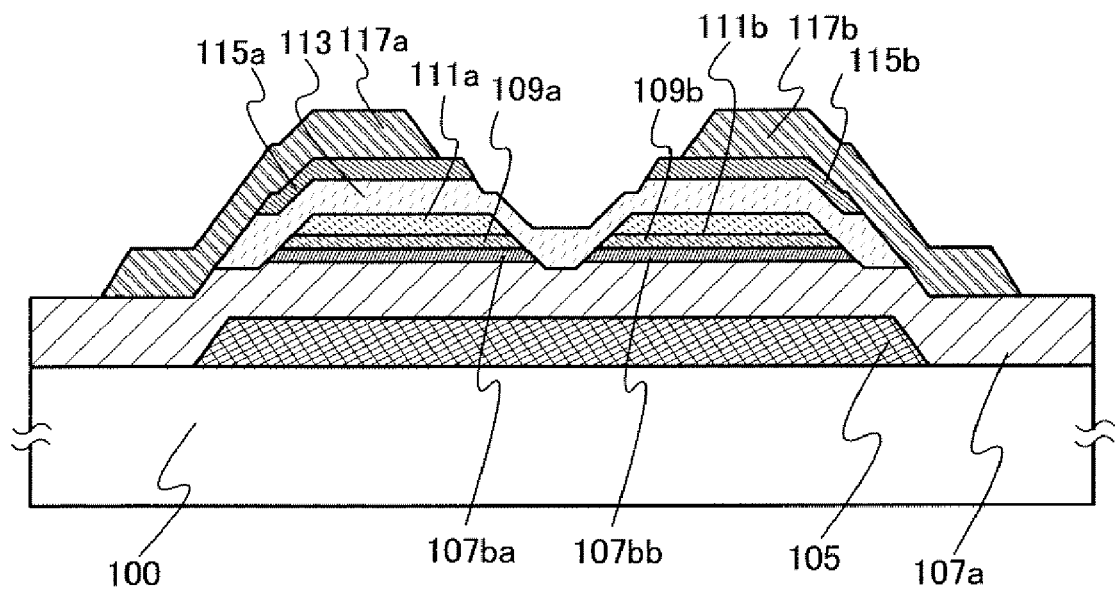
Figure 2:
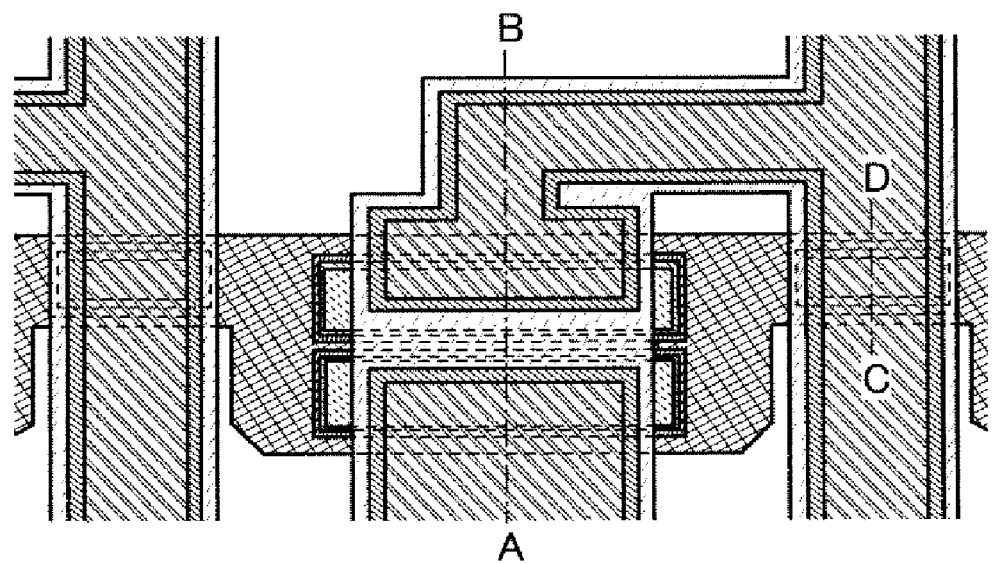
FIG. 2 illustrates a method for manufacturing thin film transistors.

In this embodiment, a process for manufacturing the thin film transistor illustrated in FIG. 1B is described with reference to FIG. 6, FIGS. 7A to 7D, and FIGS. 8A to 8D. FIGS. 7A to 7D are cross-sectional views along A-B in FIG. 6, and FIGS. 8A to 8D are cross-sectional views along C-D in FIG. 6.

The gate electrode layer 105 is formed in a manner similar to Embodiment 2. Next, the first insulating layer 107a is formed over the gate electrode layer 105 and the substrate 100. Although the first insulating layer 107a is a single layer in FIGS. 7A to 7D, a plurality of insulating layers may be stacked to form the first insulating layer 107a as described in Embodiment 1. After that, the second insulating layers 107ba and 107bb which are provided apart from each other, the microcrystalline semiconductor layers 109a and 109b which are provided apart from each other, and the buffer layers 111a and 111b which are provided apart from each other are stacked in order over the first insulating layer 107a, in a manner similar to Embodiment 2. Then, a resist is applied to the buffer layer 110. Next, the microcrystalline semiconductor layer 108 and the buffer layer 110 are etched using a resist mask which is formed through a photolithography process, thereby forming the microcrystalline semiconductor layers 109a and 109b and the buffer layers 111a and 111b.

Figure 7A:
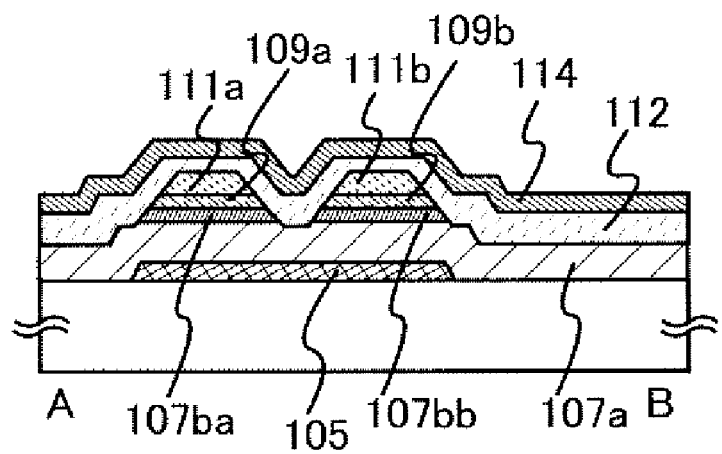
FIGS. 7A to 7D illustrate a method for manufacturing thin film transistors.
Figure 7B:
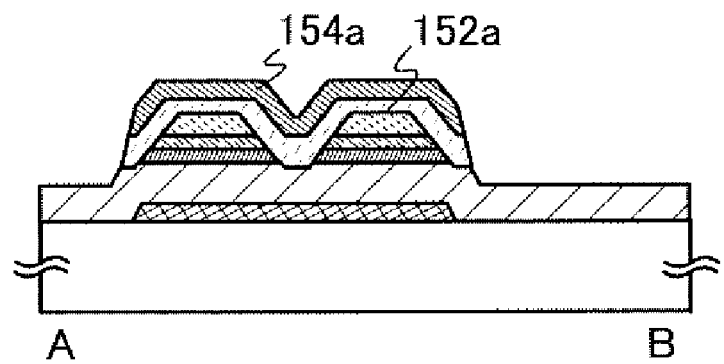

Next, the amorphous semiconductor layer 112 and the impurity semiconductor layer 114 are formed (see FIG. 7A).

Then, a resist is applied to the impurity semiconductor layer 114 and a resist mask is formed through a photolithography process. With the use of the resist mask, the impurity semiconductor layer 114 and the amorphous semiconductor layer 112 are etched into desired shapes, whereby an amorphous semiconductor layer 152a and an impurity semiconductor layer 154a are formed in a region where the thin film transistor is to be formed (see FIG. 7B). In a region where a gate wiring and a source wiring intersect with each other, an amorphous semiconductor layer 152b and an impurity semiconductor layer 154b are formed. After that, the resist mask is removed. Note that the amorphous semiconductor layer 152a covers side surfaces of the microcrystalline semiconductor layers 109a and 109b.

Figure 7C:
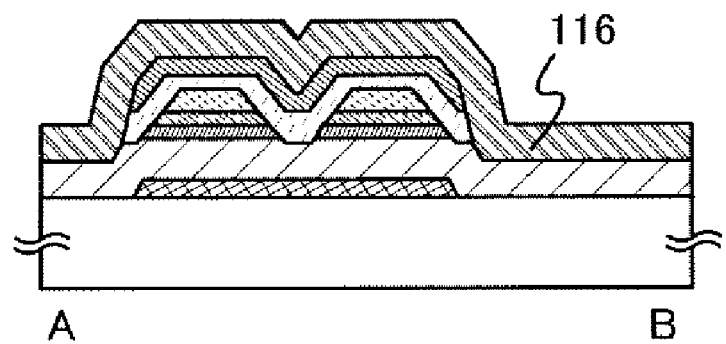
Figure 7D:
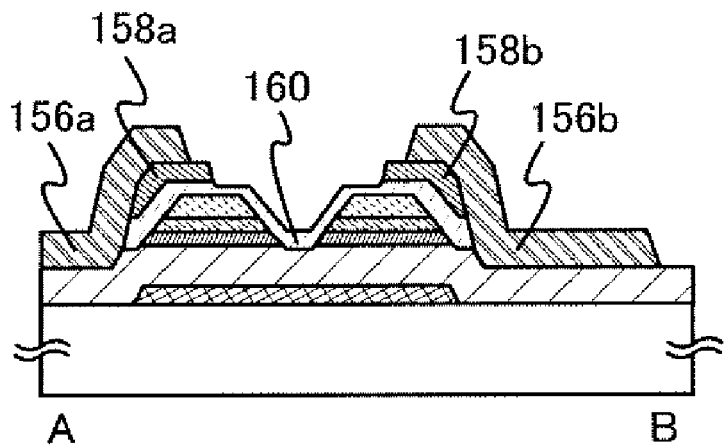
Figure 8A:
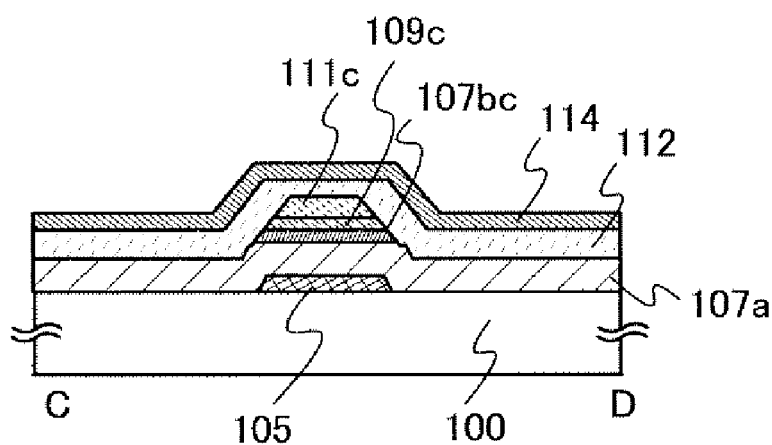
FIGS. 8A to 8D illustrate a method for manufacturing a thin film transistor.
Figure 8B:
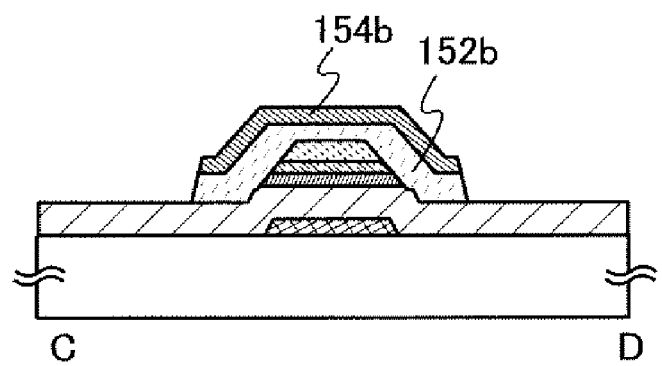
Figure 8C:
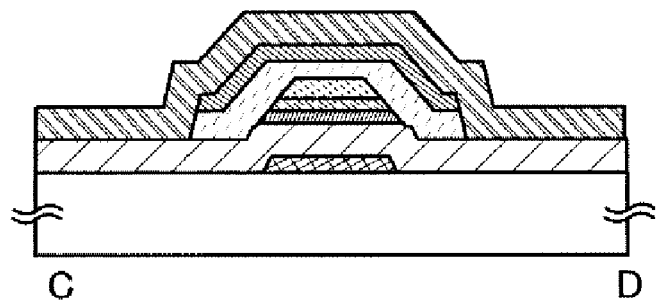
Figure 8D:
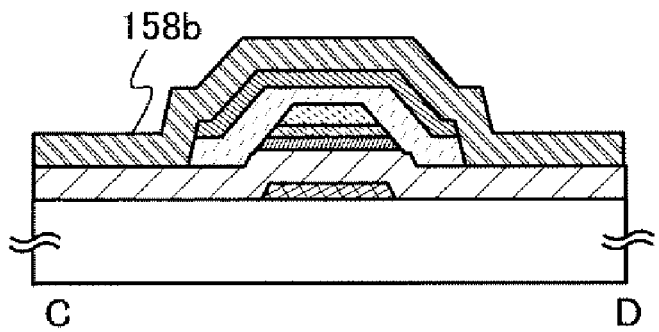

Then, the conductive layer 116 is formed (see FIG. 7C).

Next, a resist is applied to the conductive layer 116 and a resist mask is formed through a photolithography process. With the use of the resist mask, the conductive layer 116 is etched into a desired shape, thereby forming wiring layers 156a and 156b (see FIG. 7D).

At the intersection of the gate electrode layer 105 and the wiring layer 156b, the microcrystalline semiconductor layer 109c, the buffer layer 111c, and the amorphous semiconductor layer 152b are formed in addition to the first insulating layer 107a. Thus, the distance between the gate electrode layer 105 and the wiring layer 156b can be lengthened. Therefore, the parasitic capacitance in a region where the gate electrode layer 105 intersects with the wiring layer 156b can be decreased. FIGS. 8A to 8D illustrate a process for manufacturing a portion where the gate electrode layer 105 intersects with the wiring layer 156b.

Next, the impurity semiconductor layer 154a including the impurity element imparting one conductivity type is etched using a resist mask, thereby forming impurity semiconductor layers 158a and 158b. In this etching step, the amorphous semiconductor layer 152a is also etched partly, so that an amorphous semiconductor layer 160 which has a depressed portion is formed. In this manner, the source region and the drain region and the depressed portion of the amorphous semiconductor layer 160 can be formed in the same step. After that, the resist mask is removed.

After the removal of the resist mask, $H_2O$ plasma treatment is preferably performed. The $H_2O$ plasma treatment can be performed typically in such a manner that radicals are generated by discharging vaporized water in plasma and a surface to be irradiated is irradiated with the radicals. When the $H_2O$ plasma treatment is performed on the amorphous semiconductor layer 160, the impurity semiconductor layers 158a and 158b, and the wiring layers 156a and 156b, the thin film transistor can operate at high speed and the on current thereof can be further increased. Further, the off current can be decreased.

Through the above-described steps, the thin film transistor can be manufactured.

In this manner, the thin film transistor which has low off current and high on current and which can operate at high speed can be manufactured. Further, an element substrate including the thin film transistor as a switching element of a pixel electrode can be manufactured. As for the number of photomasks used in the manufacturing process as a whole, the description in Embodiment 2 also applies to this embodiment.

EXAMPLE

This example shows measurement results of the I-V characteristic of the thin film transistor described in Embodiment 1.

In this example, a glass substrate was used. The gate electrode layer was formed using a molybdenum layer of approximately 150 nm thick by a sputtering method. The first insulating layer was formed using a silicon nitride layer of approximately 300 nm thick by a CVD method. The second insulating layer was formed using a silicon oxynitride layer of approximately 10 nm thick by a CVD method. The microcrystalline semiconductor layer was formed using a microcrystalline silicon layer of approximately 20 nm thick by a CVD method. The buffer layer was formed using an amorphous silicon layer of approximately 20 nm thick by a CVD method. The amorphous semiconductor layer was formed using an amorphous silicon layer of approximately 70 nm thick by a CVD method. The impurity semiconductor layer was formed using an amorphous silicon layer including phosphorus of approximately 50 nm thick by a CVD method. The wiring layer was formed using a molybdenum layer of approximately 300 nm thick by a sputtering method. Over the wiring layer, a silicon nitride layer of approximately 300 nm thick was formed as a protection layer by a CVD method.

The sputtering method employed in the formation of the above layers was performed in an argon atmosphere with a chamber pressure of 0.3 Pa. As for the CVD method, the temperature was set at approximately 280° C.

In the formation of the microcrystalline semiconductor layer, the flow rate of silane gas was about 10 sccm, the flow rate of phosphine diluted with hydrogen by about 20 times was about 30 sccm, and the flow rate of hydrogen was about 1500 sccm.

The amorphous semiconductor layer was formed in such a manner that the substrate was exposed to an ammonia atmosphere for 60 seconds, film deposition was performed under the condition in which the flow rate of silane was set to 10 sccm and the flow rate of hydrogen was set to 1500 sccm, and then film deposition was performed under the condition in which the flow rate of silane was set to 280 sccm and the flow rate of hydrogen was set to 300 seem.

Figure 9:
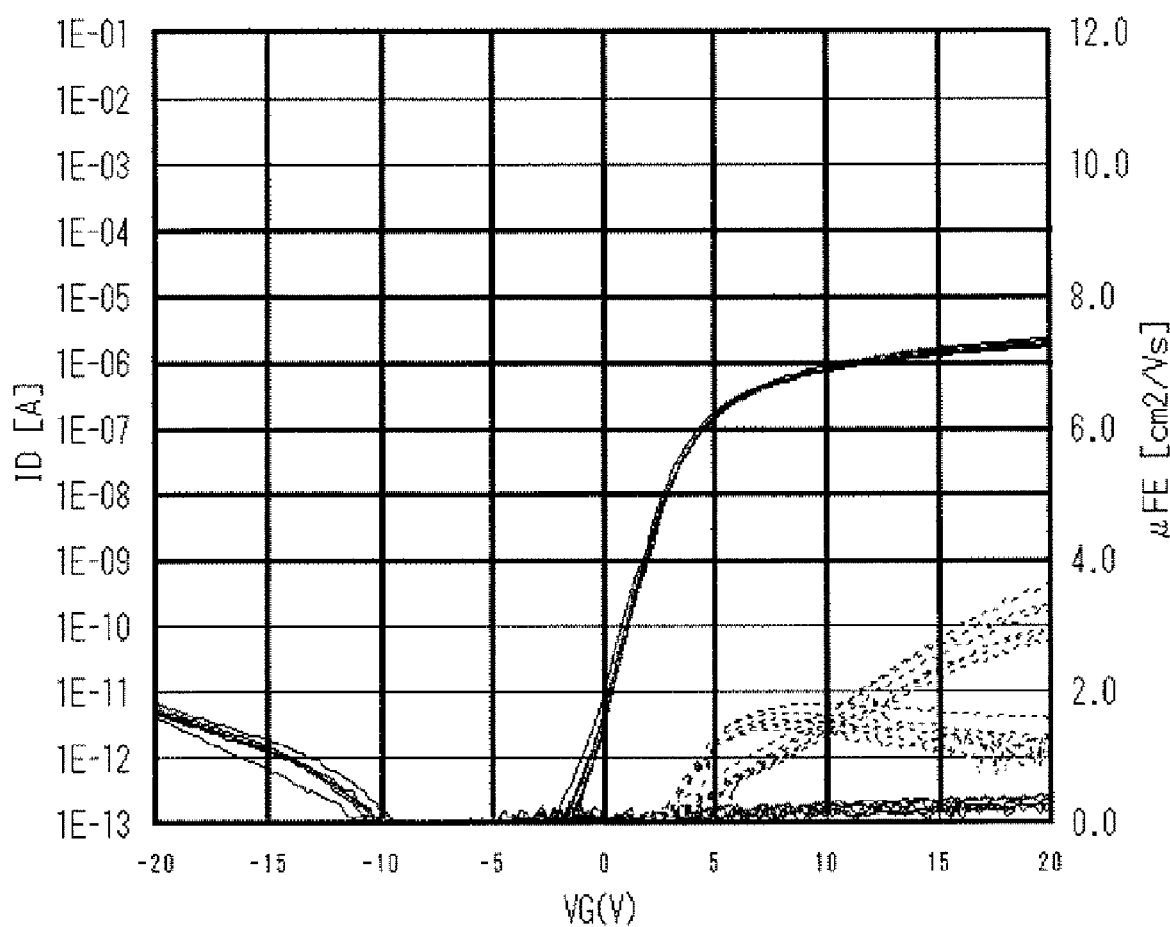
FIG. 9 shows measurement results of electrical characteristics of a thin film transistor.

FIG. 9 shows gate voltage (horizontal axis) and drain current (vertical axis) and field effect mobility when drain voltage (difference in potential between the source and the drain) is 1 V.

As shown in FIG. 9, the thin film transistor according to an embodiment of the present invention has an excellent switching characteristic, that is, high on current, low off current, and high field effect mobility.

This application is based on Japanese Patent Application serial no. 2008-070451 filed with Japan Patent Office on Mar. 18, 2008, the entire contents of which are hereby incorporated by reference.

What is claimed is:

1. A thin film transistor comprising:
   a gate electrode layer;
   a first insulating layer over the gate electrode layer;
   a pair of second insulating layers over the first insulating layer, wherein the pair of second insulating layers is provided apart from each other in a channel length direction and overlaps with at least a part of the gate electrode layer;
   a pair of microcrystalline semiconductor layers over the pair of second insulating layers, wherein the pair of microcrystalline semiconductor layers is provided apart from each other and in contact with the pair of second insulating layers;
   an amorphous semiconductor layer over the first insulating layer, the pair of second insulating layers, and the pair of microcrystalline semiconductor layers, wherein a part of the amorphous semiconductor layer is provided between the pair of microcrystalline semiconductor layers; and
   a pair of impurity semiconductor layers over the amorphous semiconductor layer, wherein the pair of impurity semiconductor layers overlaps with at least a part of the gate electrode layer and is provided apart from each other so as to form a source region and a drain region,
   wherein the first insulating layer is a silicon nitride layer, and each of the pair of second insulating layers is a silicon oxynitride layer.

2. A thin film transistor comprising:
a gate electrode layer;
a first insulating layer over the gate electrode layer;
an amorphous semiconductor layer over the first insulating layer and in contact with at least a part of the first insulating layer;
a pair of impurity semiconductor layers over the amorphous semiconductor layer, wherein the pair of impurity semiconductor layers is provided apart from each other so as to form a source region and a drain region;
a pair of second insulating layers between the first insulating layer and the amorphous semiconductor layer, wherein the pair of second insulating layers is provided apart from each other; and
a pair of microcrystalline semiconductor layers on and in contact with the pair of the second insulating layers, wherein the pair of microcrystalline semiconductor layers is provided apart from each other and overlaps with at least a part of the pair of impurity semiconductor layers,
wherein the first insulating layer is a silicon nitride layer and each of the pair of the second insulating layers is a silicon oxynitride layer.

3. A thin film transistor comprising:
a gate electrode layer;
a first insulating layer over the gate electrode layer;
a pair of second insulating layers over the first insulating layer,
a pair of microcrystalline semiconductor layers on and in contact with the pair of second insulating layers;
an amorphous semiconductor layer over the pair of microcrystalline semiconductor layers; and
a source region and a drain region over the amorphous semiconductor layer,
wherein a portion of the amorphous semiconductor layer is between the pair of microcrystalline semiconductor layers, and
wherein the first insulating layer is a silicon nitride layer and each of the pair of second insulating layers is a silicon oxynitride layer.

4. The thin film transistor according to claim 1,
wherein a first portion of the first insulating layer which overlaps with the second insulating layers is thicker than a second portion of the first insulating layer which does not overlap with the second insulating layers and overlaps with the gate electrode layer.

5. The thin film transistor according to claim 2,
wherein a first portion of the first insulating layer which overlaps with the second insulating layers is thicker than a second portion of the first insulating layer which does not overlap with the second insulating layers and overlaps with the gate electrode layer.

6. The thin film transistor according to claim 3,
wherein a first portion of the first insulating layer which overlaps with the second insulating layers is thicker than a second portion of the first insulating layer which does not overlap with the second insulating layers and overlaps with the gate electrode layer.

7. The thin film transistor according to claim 1,
wherein a side surface of the microcrystalline semiconductor layer is aligned with a side surface of the second insulating layer.

8. The thin film transistor according to claim 2,
wherein a side surface of the microcrystalline semiconductor layer is aligned with a side surface of the second insulating layer.

9. The thin film transistor according to claim 3,
wherein a side surface of the microcrystalline semiconductor layer is aligned with a side surface of the second insulating layer.

10. The thin film transistor according to claim 1,
wherein the pair of microcrystalline semiconductor layers has an electrical conductivity of greater than or equal to $1\times10^{-5}$ S·cm$^{-1}$ and less than or equal to $5\times10^{-2}$ S·cm$^{-1}$.

11. The thin film transistor according to claim 2,
wherein the pair of microcrystalline semiconductor layers has an electrical conductivity of greater than or equal to $1\times10^{-5}$ S·cm$^{-1}$ and less than or equal to $5\times10^{-2}$ S·cm$^{-1}$.

12. The thin film transistor according to claim 3,
wherein the pair of microcrystalline semiconductor layers has an electrical conductivity of greater than or equal to $1\times10^{-5}$ S·cm$^{-1}$ and less than or equal to $5\times10^{-2}$ S·cm$^{-1}$.

13. The thin film transistor according to claim 1,
wherein the pair of the microcrystalline semiconductor layers includes an impurity element serving as a donor.

14. The thin film transistor according to claim 2,
wherein the pair of the microcrystalline semiconductor layers includes an impurity element serving as a donor.

15. The thin film transistor according to claim 3,
wherein the pair of the microcrystalline semiconductor layers includes an impurity element serving as a donor.

16. The thin film transistor according to claim 13,
wherein a concentration of the impurity element of the pair of microcrystalline semiconductor layers is greater than or equal to $1\times10^{18}$ cm$^{-3}$ and less than or equal to $1\times10^{21}$ Cm$^{-3}$.

17. The thin film transistor according to claim 14,
wherein a concentration of the impurity element of the pair of microcrystalline semiconductor layers is greater than or equal to $1\times10^{18}$ cm$^{-3}$ and less than or equal to $1\times10^{21}$ cm$^{-1}$.

18. The thin film transistor according to claim 15,
wherein a concentration of the impurity element of the pair of microcrystalline semiconductor layers is greater than or equal to $1\times10^{18}$ cm$^{-3}$ and less than or equal to $1\times10^{21}$ cm$^{-3}$.

19. The thin film transistor according to claim 1,
wherein the amorphous semiconductor layer is an amorphous silicon layer.

20. The thin film transistor according to claim 2,
wherein the amorphous semiconductor layer is an amorphous silicon layer.

21. The thin film transistor according to claim 3,
wherein the amorphous semiconductor layer is an amorphous silicon layer.

22. The thin film transistor according to claim 1,
wherein the pair of microcrystalline semiconductor layers comprises phosphorus and silicon.

23. The thin film transistor according to claim 2,
wherein the pair of microcrystalline semiconductor layers comprises phosphorus and silicon.

24. The thin film transistor according to claim 3,
wherein the pair of microcrystalline semiconductor layers comprises phosphorus and silicon.

* * * * *

UNITED STATES PATENT AND TRADEMARK OFFICE
CERTIFICATE OF CORRECTION

| | | |
|---|---|---|
| PATENT NO. | : 7,821,012 B2 | Page 1 of 1 |
| APPLICATION NO. | : 12/397460 | |
| DATED | : October 26, 2010 | |
| INVENTOR(S) | : Yasuhiro Jinbo et al. | |

It is certified that error appears in the above-identified patent and that said Letters Patent is hereby corrected as shown below:

column 1, line 13, "semiconductor 1 layers" should read "semiconductor layers"

column 1, line 21, "HS" should read "H5"

column 2, line 1, "mm x 2400 mm)" should read "mm x 2400mm)."

column 6, line 16, "respectively:" should read "respectively;"

column 7, line 19, "Cm$^{-3}$" should read "cm$^{-3}$"

column 8, line 56, "1A" should read "11A"

column 14, line 9, "Mhz" should read "MHz"

column 14, line 29, "layer," should read "layer."

column 17, line 14, "Further;" should read "Further,"

column 17, line 43, "135" should read "105"

column 19, line 56, "1-V" should read "I-V"

column 20, line 28, "seem" should read "sccm"

claim 3, column 21, line 29, "layer," should read "layer;"

Signed and Sealed this
Nineteenth Day of April, 2011

David J. Kappos
*Director of the United States Patent and Trademark Office*